(12) United States Patent
Shin et al.

(10) Patent No.: US 12,193,257 B2
(45) Date of Patent: Jan. 7, 2025

(54) DISPLAY DEVICE

(71) Applicant: Samsung Display Co., LTD., Yongin-si (KR)

(72) Inventors: Hyeon Woo Shin, Suwon-si (KR); Beom Yeol Park, Suwon-si (KR); Ji Ryun Park, Cheonan-si (KR); Ji Seon Lee, Hwaseong-si (KR); Seung Hwan Cho, Yongin-si (KR); Won Suk Choi, Seoul (KR); Yoon Sun Choi, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 469 days.

(21) Appl. No.: 17/560,966

(22) Filed: Dec. 23, 2021

(65) Prior Publication Data

US 2022/0352485 A1    Nov. 3, 2022

(30) Foreign Application Priority Data

Apr. 30, 2021   (KR) .......................... 10-2021-0056851

(51) Int. Cl.
*H10K 50/844* (2023.01)
*H10K 59/122* (2023.01)
*H10K 59/131* (2023.01)

(52) U.S. Cl.
CPC ......... *H10K 50/844* (2023.02); *H10K 59/122* (2023.02); *H10K 59/131* (2023.02)

(58) Field of Classification Search
CPC .. H10K 59/131; H10K 59/122; H10K 50/844; H10K 59/8731; H10K 59/18; H10K 77/111; H10K 59/1315; H10K 59/8722; H10K 50/8426; H10K 59/1201; H10K 71/421; H10K 77/10; H10K 59/38; H10K 50/8428; H10K 59/123; H10K 59/1213; H10K 50/824; H10K 59/80522;
(Continued)

(56) References Cited

U.S. PATENT DOCUMENTS

2018/0102502 A1\*  4/2018  Kim ........................ H01L 22/12
2019/0131360 A1\*  5/2019  Lee ...................... H10K 59/131
(Continued)

FOREIGN PATENT DOCUMENTS

CN         113497098 A      10/2021
KR      1020190109690 A       9/2019
(Continued)

*Primary Examiner* — Mouloucoulaye Inoussa
(74) *Attorney, Agent, or Firm* — CANTOR COLBURN LLP

(57) ABSTRACT

A display device including a light-emitting element, an encapsulation layer over the light-emitting element and including a first inorganic encapsulation layer, an organic encapsulation layer and a second inorganic encapsulation layer in order, and the first inorganic encapsulation layer and the second inorganic encapsulation layer in direct contact with each other to define an inorganic encapsulation area of the display device, a supply voltage line electrically connected to the light-emitting element, a signal line which provides an electrical signal to the display area, and within the inorganic encapsulation area of the display device, the signal line overlapping the supply voltage line and an etch stop pattern between the supply voltage line and the signal line which overlap each other.

20 Claims, 13 Drawing Sheets

(58) Field of Classification Search
CPC ...... H10K 59/40; H10K 59/873; H10K 59/88;
H10K 2102/311; H01L 25/0655; H01L
25/167; H01L 25/0753; H01L 25/18;
H01L 27/0288; H01L 23/60; H01L
27/124; H01L 27/0296; G06F 1/189;
G09G 3/3225; G09G 3/3275; G09G
3/3233; G09G 3/035; G09G 3/006; G09G
3/3258; G09G 3/3291; G09G 2300/0426;
G09G 2310/0281; G09G 2310/0232;
G09G 2300/0819; G09G 2300/0842;
G09G 2320/0238; G09G 2310/0297;
G09G 2330/12; G09G 2320/0233; G09G
2320/0223; Y02E 10/549
See application file for complete search history.

(56) References Cited

U.S. PATENT DOCUMENTS

| | | | |
|---|---|---|---|
| 2019/0393295 A1* | 12/2019 | Moy | H10K 50/865 |
| 2020/0027943 A1* | 1/2020 | Kim | H10K 77/10 |
| 2020/0127220 A1* | 4/2020 | Kim | H10K 50/11 |
| 2020/0176538 A1* | 6/2020 | Um | H10K 59/121 |
| 2020/0212115 A1* | 7/2020 | Choi | H10K 50/86 |
| 2020/0273928 A1 | 8/2020 | Che et al. | |
| 2020/0321292 A1* | 10/2020 | Park | H10K 59/38 |
| 2021/0020078 A1* | 1/2021 | Park | H10K 59/8731 |
| 2021/0026423 A1* | 1/2021 | Choi | H10K 77/111 |
| 2021/0118969 A1* | 4/2021 | Kim | H10K 71/00 |
| 2021/0257435 A1* | 8/2021 | Kim | H10K 59/353 |
| 2021/0296502 A1 | 9/2021 | Joo et al. | |
| 2021/0319756 A1* | 10/2021 | Kim | G09G 3/3225 |
| 2021/0376048 A1* | 12/2021 | Kim | H10K 50/8426 |
| 2022/0028955 A1* | 1/2022 | Yoon | H10K 59/131 |
| 2022/0115448 A1* | 4/2022 | Zhang | H10K 59/131 |
| 2022/0310744 A1* | 9/2022 | Bai | H10K 59/1216 |
| 2022/0344616 A1* | 10/2022 | Du | H10K 59/8722 |

FOREIGN PATENT DOCUMENTS

| | | |
|---|---|---|
| KR | 1020190112884 A | 10/2019 |
| KR | 1020200039904 A | 4/2020 |

* cited by examiner

DISPLAY DEVICE

This application claims priority to Korean Patent Application No. 10-2021-0056851 filed on Apr. 30, 2021, and all the benefits accruing therefrom under 35 U.S.C. § 119, the disclosure of which is incorporated herein by reference in its entirety.

BACKGROUND

1. Field

The present disclosure relates to a display device.

2. Description of the Related Art

As the information-oriented society evolves, various demands for display devices are ever increasing. For example, display devices are being employed by a variety of electronic devices such as smart phones, digital cameras, laptop computers, navigation devices, and smart televisions.

As such display devices, a variety of types of display devices such as liquid-crystal display (LCD) devices and organic light-emitting display (OLED) devices are used. Among them, an organic light-emitting display device displays images by using an organic light-emitting device that emits light as electrons and holes recombine.

An organic light-emitting display device includes pixels connected to scan lines and data lines, a scan driver that applies scan signals to the scan lines, a data driver that applies data voltages to the data lines, and a supply voltage line that applies supply voltage to the pixels. The scan driver may generate scan signals in response to scan driving signals input through scan driving lines and may output the generated scan signals to the scan lines.

SUMMARY

Embodiments of the present disclosure provide a display device capable of suppressing or effectively preventing electrical current leakage where a supply voltage line and a scan driving line overlap each other, and coupling between the two lines.

It should be noted that objects of the present disclosure are not limited to the above-mentioned object, and other objects of the present disclosure will be apparent to those skilled in the art from the following descriptions.

According to an embodiment of the disclosure, a display device includes a display area including a plurality of light-emitting elements, each of the light-emitting elements including an anode electrode, an emission layer, and a cathode electrode, an encapsulation layer over the plurality of light-emitting elements and including a first inorganic encapsulation layer, an organic encapsulation layer, and a second inorganic encapsulation layer, a dam surrounding the display area, a bank on an outer side of the dam, a supply voltage line electrically connected to the cathode electrode, a signal line overlapping the supply voltage line, an etch stop pattern between the supply voltage line and the signal line, and an inorganic encapsulation area between the dam and the bank. The first inorganic encapsulation layer and the second inorganic encapsulation layer are in direct contact with each other in the inorganic encapsulation area. The etch stop pattern is in the inorganic encapsulation area.

At least a part of an overlapping area where the supply voltage line and the signal line overlap each other may overlap with the inorganic encapsulation area.

At least a part of the etch stop pattern may overlap with at least a part of the overlapping area.

The display device may further include a substrate, a first conductive layer on the substrate, a first organic insulating layer on the first conductive layer, a second conductive layer on the first organic insulating layer, a second organic insulating layer on the second conductive layer, and a third conductive layer on the second organic insulating layer. The supply voltage line may be a pattern of the third conductive layer.

The etch stop pattern may be a pattern of one of the first conductive layer and the second conductive layer.

The supply voltage line and the etch stop pattern may be in direct contact with each other.

The etch stop pattern may include a first stack pattern as a pattern of the first conductive layer, and a second stack pattern as a pattern of the second conductive layer.

The display device may further include a third organic insulating layer on the third conductive layer. The anode electrode may be on the third organic insulating layer.

The display device may further include an inorganic insulating layer between the etch stop pattern and the signal line. The inorganic insulating layer may have a first thickness where it overlaps the etch stop pattern, and may have a second thickness smaller than the first thickness where it does not overlap the etch stop pattern.

The first inorganic encapsulation layer may be in direct contact with the supply voltage line in the inorganic encapsulation area.

The display device may further include a scan driver connected to one end of the signal line, and a driver chip connected to an opposite end of the signal line.

The display device may further include a non-display area around the display area. The supply voltage line and the signal line may overlap each other in the non-display area.

According to an embodiment of the disclosure, a display device includes a substrate, a signal line on the substrate, a first inorganic insulating layer on the signal line, a first conductive layer on the first inorganic insulating layer, a first organic insulating layer on the first conductive layer, a second conductive layer on the first organic insulating layer, a second organic insulating layer on the second conductive layer, a third conductive layer on the second organic insulating layer and including a supply voltage line overlapping the signal line, a third organic insulating layer on the third conductive layer, a light-emitting element on the third organic insulating layer and including an anode electrode, an emission layer, and a cathode electrode electrically connected to the supply voltage line, an encapsulation layer on the cathode electrode and including a first inorganic encapsulation layer, an organic encapsulation layer, and a second inorganic encapsulation layer, and an etch stop pattern on at least a part of an overlapping area where the signal line and the supply voltage line overlap each other.

The display device may further include an inorganic encapsulation area in which the first inorganic encapsulation layer and the second inorganic encapsulation layer are in direct contact with each other, the inorganic encapsulation area at least partially overlaps with the overlapping area. The etch stop pattern may include at least one of the first conductive layer and the second conductive layer, and may be in the overlapping area overlapping with the inorganic encapsulation area.

The display device may further include a dam surrounding the light-emitting element, and a bank on an outer side of the dam. The inorganic encapsulation area may be between the dam and the bank.

The first inorganic encapsulation layer may be in direct contact with the supply voltage line in the inorganic encapsulation area.

The display device may further include a display area displaying images, and a non-display area around the display area. The inorganic encapsulation area may be in the non-display area.

The supply voltage line and the etch stop pattern may be in direct contact with each other.

According to an embodiment of the disclosure, a display device includes a display area including a plurality of light-emitting elements, each of the light-emitting elements including an anode electrode, an emission layer, and a cathode electrode, an encapsulation layer over the plurality of light-emitting elements and including a first inorganic encapsulation layer, an organic encapsulation layer, and a second inorganic encapsulation layer, a dam surrounding the display area, a bank on an outer side of the dam, a supply voltage line electrically connected to the cathode electrode, a signal line overlapping the supply voltage line, an etch stop pattern between the supply voltage line and the signal line, and an inorganic insulating layer between the etch stop pattern and the signal line. The inorganic insulating layer has a first thickness where it overlaps the etch stop pattern, and has a second thickness smaller than the first thickness where it does not overlap the etch stop pattern.

The display device may further include an inorganic encapsulation area between the dam and the bank. The first inorganic encapsulation layer and the second inorganic encapsulation layer may be in direct contact with each other in the inorganic encapsulation area. At least a part of an overlapping area where the supply voltage line and the signal line overlap each other may be in the inorganic encapsulation area. The etch stop pattern may be in the inorganic encapsulation area overlapping with the overlapping area.

According to an embodiment of the present disclosure, an etch stop pattern is between a supply voltage line and a scan driving line, so that it is possible to suppress or effectively prevent electrical current leakage where the supply voltage line and the scan driving line overlap each other, and coupling between the two lines.

According to an embodiment of the present disclosure, it is possible to suppress or effectively prevent the issue of heat generation in the supply voltage line.

It should be noted that effects of the present disclosure are not limited to those described above and other effects of the present disclosure will be apparent to those skilled in the art from the following descriptions.

BRIEF DESCRIPTION OF THE DRAWINGS

The above and other features of the present disclosure will become more apparent by describing in detail embodiments thereof with reference to the attached drawings, in which.

DETAILED DESCRIPTION

Figure 1:
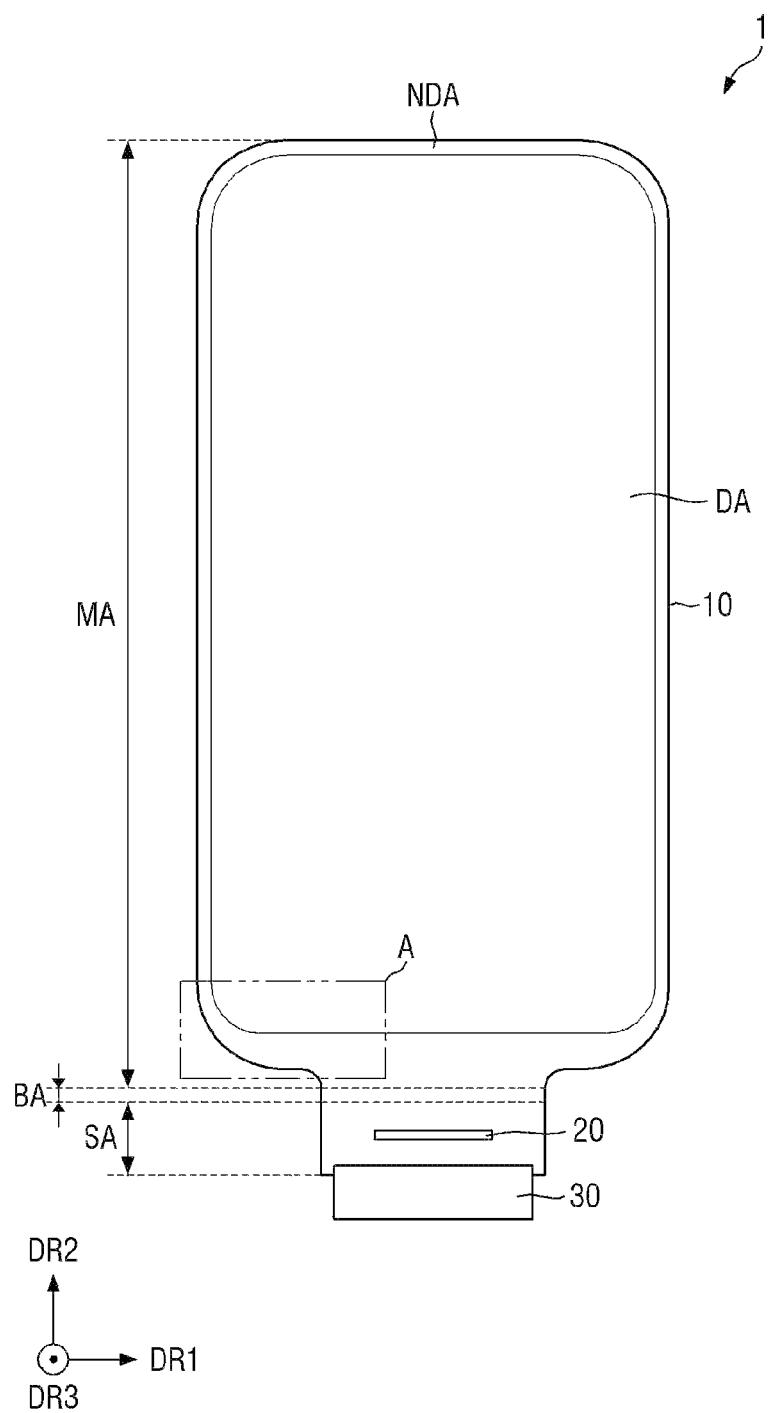
FIG. 1 is a plan view of an embodiment of a display device.

In the following description, for the purposes of explanation, numerous details are set forth in order to provide a thorough understanding of various embodiments or implementations of the disclosure. As used herein "embodiments" and "implementations" are interchangeable words that are non-limiting examples of devices or methods employing one or more of the disclosure disclosed herein. It is apparent, however, that various embodiments may be practiced without these details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in other embodiments without departing from the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When an embodiment may be implemented differently, a process order may be performed differently from the described order. For example, two consecutively described processes may be performed substantially at the same time or performed in an order opposite to the described order. Also, like reference numerals denote like elements. As used herein, a reference number may indicate a singular element or a plurality of the element. For example, a reference number labeling a singular form of an element within the drawing figures may be used to reference a plurality of the singular element within the text of specification.

When an element, such as a layer, is referred to as being related to another element such as being "on," "connected to," or "coupled to" another element or layer, it may be directly on, connected to, or coupled to the other element or layer or intervening elements or layers may be present. When, however, an element or layer is referred to as being related to another element such as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation, not as terms of degree, and thus are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Unless otherwise defined or implied herein, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or overly formal sense, unless clearly so defined herein.

Figure 2:
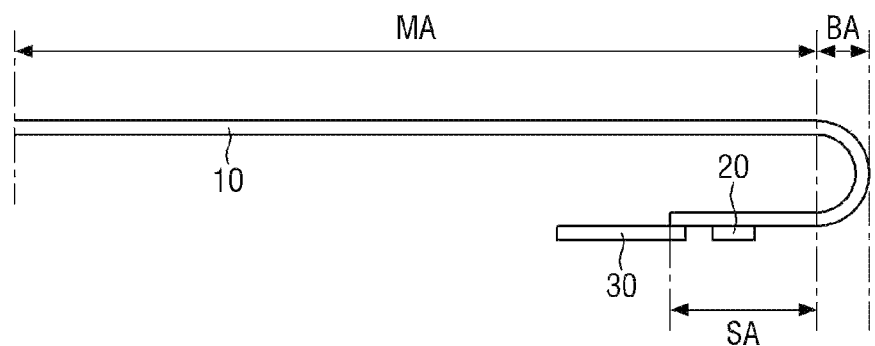
FIG. 2 is a side view of the display device of FIG. 1 which is bent.
Figure 2:
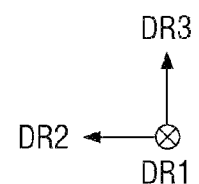

FIG. 1 is a plan view of an embodiment of a display device 1. FIG. 2 is a side view of the display device 1 of FIG. 1. FIG. 2 shows a side shape of a display device 1 which is bent in (or along) thickness direction.

In the drawings, a first direction DR1 denotes the horizontal direction of a display device 1 and a second direction DR2 denotes the vertical direction of the display device 1 when viewed from the top (e.g., a plan view) along a thickness direction of the display device 1. In addition, the third direction DR3 may refer to the thickness direction of the display device 1. The first direction DR1 crosses or interests the second direction DR2, such as being perpendicular to the second direction DR2. The first direction DR1 and the second direction DR2 which cross each other may define a plane. The third direction DR3 crosses or intersects the plane, such as being orthogonal to the plane in which the first direction DR1 and the second direction DR2 lie and being perpendicular to the first and second directions DR1 as well as the second direction DR2. It should be understood that the directions referred to in the embodiments are relative directions, and the embodiments are not limited to the directions mentioned.

In the following description, in a plan view, the first direction DR1 indicates the right direction, the opposite direction of the first direction DR1 indicates the left direction, the second direction DR2 indicates the upper direction, and the opposite direction of the second direction DR2 indicates the lower direction, unless specifically stated otherwise. In addition, the terms "top", "upper surface" and "upper side" in the third direction DR3 refer to the display side of a display panel 10, whereas the terms "bottom", "lower surface" and "lower" refer to the opposite side of the display panel 10, unless stated otherwise.

Referring to FIGS. 1 and 2, the display device 1 displays moving images or still images. The display device 1 may be used as the display screen of portable electronic devices such as a mobile phone, a smart phone, a tablet personal computer (PC), a smart watch, a watch phone, a mobile communications terminal, an electronic notebook, an electronic book, a portable multimedia player (PMP), a navigation device and an ultra-mobile PC (UMPC), as well as the display screen of various products such as a television, a notebook, a monitor, a billboard and the Internet of Things.

According to an embodiment of the present disclosure, the display device 1 may have a substantially rectangular shape when viewed from the top. The display device 1 may have a rectangular shape with corners at right angles when viewed from the top. It is, however, to be understood that the present disclosure is not limited thereto. The display device 1 may have a rectangular shape with rounded corners when viewed from the top.

When the display device 1 has a rectangular shape when viewed from the top, the length of two sides which are disposed on one side and the other side in the first direction DR1, respectively, and are extended in the second direction DR2 may be larger than the length of two sides which are disposed on one side and the other side in the second direction DR2, respectively, and are extended in the first direction DR1. In other words, the two sides of the display device 1 disposed on one side and the other side in the first direction DR1, respectively, may be longer sides, and the two sides of the display device 1 disposed on one side and the other side in the second direction DR2, respectively, may be shorter sides.

The display device 1 may include a display panel 10. The display panel 10 may be flexible. The display panel 10 may include a flexible substrate including a flexible polymer material such as polyimide. Accordingly, the display panel 10 may be curved, bent, folded, or rolled (e.g., curvable, bendable, foldable, or rollable).

The display panel 10 may be an organic light-emitting display panel. In the following description, the organic light-emitting display panel is employed as the display panel 10. It is, however, to be understood that the display panel 10 may include other types of display panels such as a liquid-crystal display panel, a quantum-dot organic light-emitting display panel, a quantum-dot liquid-crystal display panel, a quantum-nano light-emitting display panel and a micro LED panel.

The display panel 10 may include a display area DA where images are displayed, and a non-display area NDA where no image is displayed. The display panel 10 may include the display area DA and the non-display area NDA when viewed from the top. The non-display area NDA is adjacent to the display area DA and may surround the display area DA. The non-display area NDA may form a bezel of the display device 1. Various elements or layers of the display device 1 may include a display area DA and a non-display area NDA corresponding to those described above.

The display area DA may conform to the overall shape (e.g., outer shape) of the display device 1 when viewed from the top. The display area DA may have a rectangular shape having corners at the right angle or rounded corners when viewed from the top. It is, however, to be understood that the present disclosure is not limited thereto. The shape of the display area DA is not limited to a rectangle, and it may have other shapes such as a circle and an ellipse.

The display area DA may include a plurality of pixels PX. The pixels PX may be arranged in a matrix. Each of the pixels PX may include an emission layer EML and a circuit layer which controls the amount of light emitted from the emission layer EML. The circuit layer may include lines, electrodes and at least one transistor. The emission layer EML may include an organic light-emitting material. The emission layer EML may be sealed by an encapsulation layer 180. The configuration of the pixels PX will be described in detail later.

The non-display area NDA may surround all of the sides of the display area DA and may form the edges (e.g., define outer edges) of the display area DA. It is, however, to be understood that the present disclosure is not limited thereto.

The display panel 10 may include a main area MA and a bending area BA which is connected to one side of the main area MA in the second direction DR2. The display panel 10 may further include a subsidiary area SA connected to one side of the bending area BA in the second direction DR2. The main area MA, the bending area BA and the subsidiary area SA may be in order along the second direction DR2. The display device 1 which is bent may dispose the subsidiary area SA overlapping the main area MA in the thickness direction.

The display area DA may be located in the main area MA. The non-display area NDA may be located at the peripheral edge of the display area DA and in the main area MA.

The main area MA may have a shape similar to the outer shape of the display device 1 when viewed from the top. The main area MA may be a flat area located in one plane. It is, however, to be understood that the present disclosure is not limited thereto. At least one of the edges of the main area MA except for the edge (side) connected to the bending area BA may be bent along the thickness direction to form a curved surface or may be bent at a right angle.

When at least one of the edges of the main area MA except for the edge (side) connected to the bending area BA is curved or bent, the display area DA may also be disposed at the curved or bent edge. It is, however, to be understood that the present disclosure is not limited thereto. The non-display area NDA that does not display image may be disposed on the curved or bent edge, or the display area DA and the non-display area NDA may be disposed together.

The non-display area NDA of the main area MA may be extended from the outer border of the display area DA to the outer edge of the display panel 10. In the non-display area NDA of the main area MA, signal lines for applying electrical signals (e.g., scan signals, data signals, timing signals, power signals, etc.) to the display area DA and/or driving circuits may be disposed.

The bending area BA may be connected to the main area MA at one shorter side of the main area MA. The width of the bending area BA (the width in the first direction DR1) may be smaller than the width of the main area MA (the width of the shorter side). The portions where the main area MA meets the bending area BA may be in an L-shape when viewed from the top in order to reduce the bezel width of the bezel of the display device 1.

In the bending area BA, the display panel 10 may be bent with a curvature toward the opposite side of the display surface. The display surface may be a surface which is furthest along the third direction DR3. The display panel 10 which is bent at the bending area BA may dispose the display surface of the display panel 10 in a reverse direction (e.g., facing opposite to the third direction DR3. Specifically, the surface of the display panel 10 facing upward in the display device 1 which is flat or unbent may face outward at the bending area BA and then face downward at the subsidiary area SA.

The subsidiary area SA is extended from the bending area BA. The subsidiary area SA may be extended in a direction parallel to the main area MA from the end of the bending region, in the display device 1 which is flat or unbent. In the display device 1 which is bent, the subsidiary area SA may overlap with the main area MA in the thickness direction of the display panel 10. The subsidiary area SA may overlap with the non-display area NDA at the edge of the main area MA (e.g., edge portion of the display device 1) and may also overlap with the display area DA of the main area MA. The width of the subsidiary area SA along the first direction DR1 may be, but is not limited to being, equal to the width of the bending area BA.

Pads (not shown) may be disposed on the subsidiary area SA of the display panel 10. The pads may be in a pad region of the display panel 10. An external device may be mounted (or attached) to the display panel 10 at the pads (not shown). Examples of the external device include a driver chip 20, a driving board 30 made of (or including) a flexible printed circuit board or a rigid printed circuit board, and other wire connection films, connectors, etc., which may also be mounted on the pad region. More than one external device may be mounted on the subsidiary area SA. As shown in FIGS. 1 and 2, for example, the driver chip 20 may be disposed in the subsidiary area SA of the display panel 10, and the driving board 30 may be attached to the display panel 10 at an end of the subsidiary area SA. In such case, the display panel 10 may include a pad region connected to the driver chip 20, and a pad region connected to the driving board 30. According to another embodiment, a driver chip 20 may be mounted on a film, and the film may be attached to the subsidiary area SA of the display panel 10.

The driver chip 20 is mounted on the surface of the display panel 10 which is coplanar with or includes the display surface. As the surface of the display panel 10 is bent at the bending area BA and reversed in direction as described above, the driver chip 20 is mounted on the surface of the display panel 10 facing downward in the thickness direction, such that the upper surface of the driver chip 20 may face downward (e.g., in a direction opposite to the third direction DR3).

The driver chip 20 may be attached on the display panel 10 by an anisotropic conductive film or on the display panel 10 by ultrasonic bonding. The driver chip 20 may include an integrated circuit for driving the display panel 10.

Figure 3:
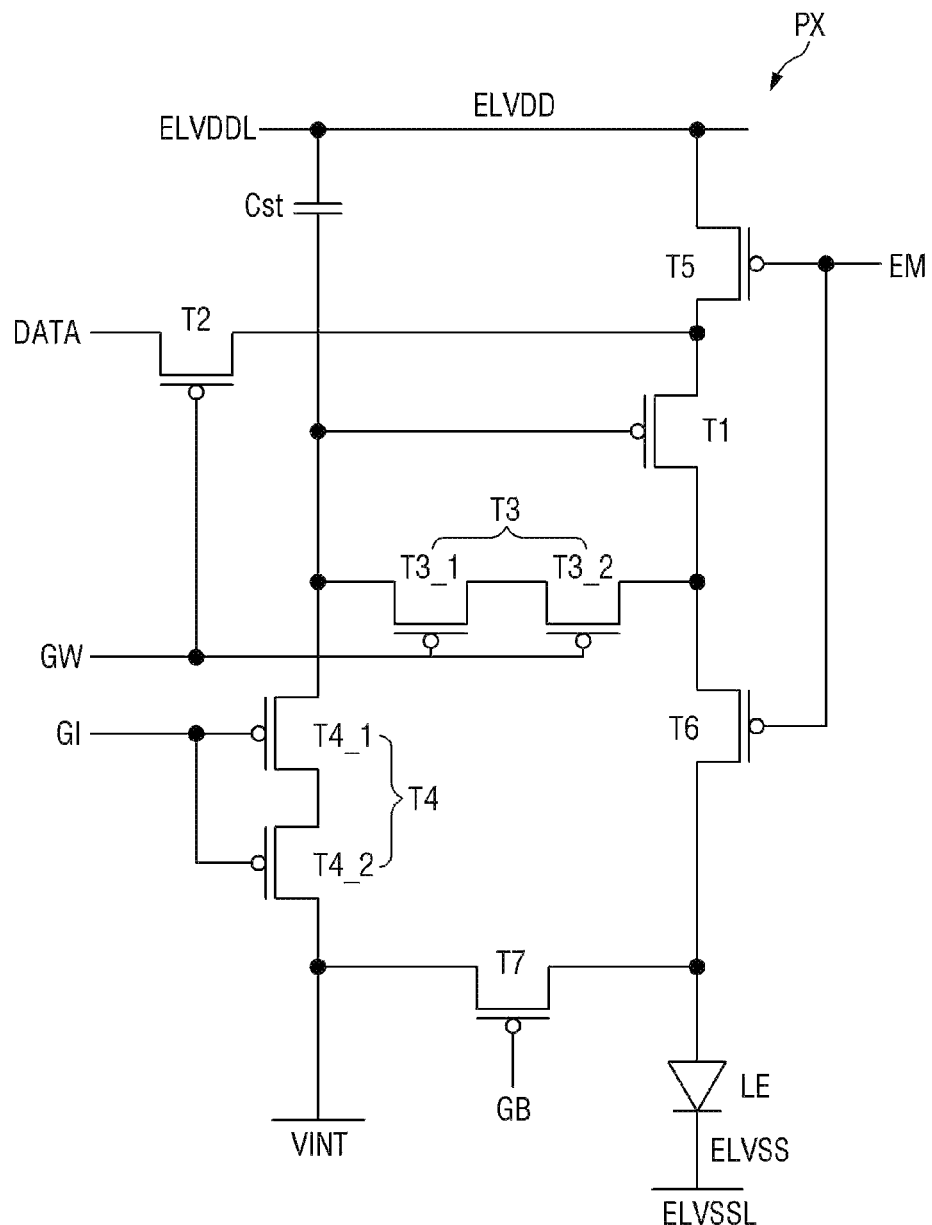
FIG. 3 is a circuit diagram showing an embodiment of a pixel.

FIG. 3 is a circuit diagram showing an embodiment of a pixel PX.

Referring to FIG. 3, the circuit of the pixel PX includes a plurality of transistors T1 to T7, a capacitor Cst, a light-emitting element LE, etc. To the circuit of a pixel PX (e.g., pixel circuit), a data signal DATA, a first scan signal GW, a second scan signal GI, a third scan signal GB, an emission control signal EM, a first supply voltage ELVDD, a second supply voltage ELVSS, and an initialization voltage VINT are applied.

Figure 4:
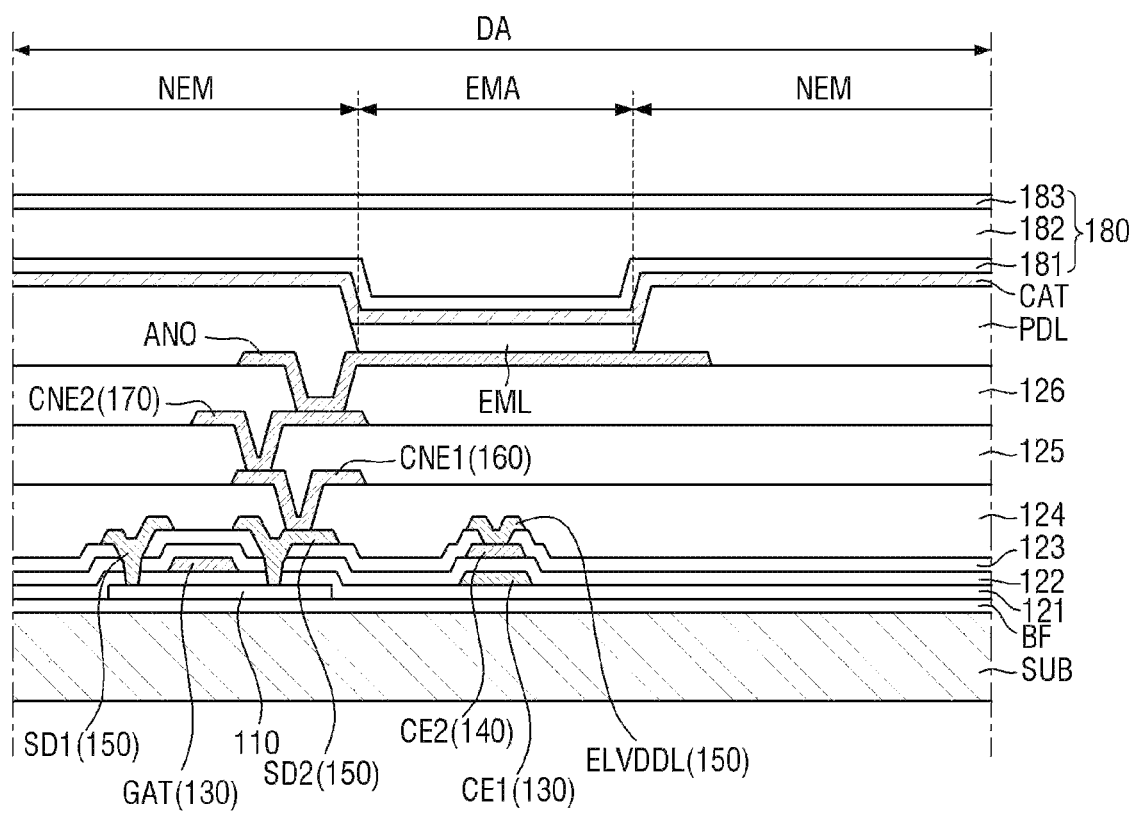
FIG. 4 is an enlarged cross-sectional view of an embodiment of a pixel of a display panel.

The light-emitting element LE may be, but is not limited to, an organic light-emitting diode that includes a first electrode or an anode electrode ANO (see FIG. 4), an emission layer EML (see FIG. 4), a second electrode or a cathode electrode CAT (see FIG. 4).

The plurality of transistors may include first to seventh transistors T1 to T7. Each of the transistors T1 to T7 includes a gate electrode, a first electrode (or a first source/drain electrode), and a second electrode (or a second source/drain electrode). One of the first electrode and the second electrode of each of the transistors T1 to T7 is a source electrode and the other is a drain electrode.

The first transistor T1 may work as a driving transistor, and the second to seventh transistors T2 to T7 may work as switching transistors. Each of the transistors T1 to T7 includes a gate electrode, a first electrode, and a second electrode. One of the first electrode and the second electrode of each of the transistors T1 to T7 is a source electrode and the other is a drain electrode.

Each of the transistors T1 to T7 may be a thin-film transistor. Each of the transistors T1 to T7 may be one of a PMOS transistor and an NMOS transistor. In an embodiment, the first transistor T1 as a driving transistor, the second transistor T2 as a data transfer transistor, the third transistor T3 as a compensating transistor, the fourth transistor T4 as a first initializing transistor, the fifth transistor T5 as a first emission control transistor, the sixth transistor T6 as a second emission control transistor, and the seventh transistor T7 as a second initializing transistor all are PMOS transistors.

It should be understood, however, that the present disclosure is not limited thereto. In an embodiment, for example, the third transistor T3 as the compensating transistor and the fourth transistor T4 as the first initializing transistor may be NMOS transistors, and the first transistor T1 as the driving transistor, the second transistor T2 as the data transfer transistor, the fifth transistor T5 as the first emission control transistor, the sixth transistor T6 as the second emission control transistor, and the seventh transistor T7 as the second initializing transistor may be PMOS transistors. In such case, the active layers of the third transistor T3 and the fourth transistor T4 may include a different material from that of the active layers of the first transistor T1, the second transistor T2, the fifth transistor T5, the sixth transistor T6 and the seventh transistor T7. Although not limited thereto, for example, the active layers of the third transistor T3 and the fourth transistor T4 may include oxide semiconductor, and the active layers of the first transistor T1, the second transistor T2, the fifth transistor T5, the sixth transistor T6 and the seventh transistor T7 may include polycrystalline silicon.

Hereinafter, each of the elements will be described in detail.

The gate electrode of the first transistor T1 is connected to a first electrode of a capacitor Cst. The first electrode of the first transistor T1 is connected to a first supply voltage line ELVDDL via the fifth transistor T5. The second electrode of the first transistor T1 is connected to the anode electrode ANO of the light-emitting element LE via the sixth transistor T6. The first transistor T1 receives the data signal DATA according to the switching operation of the second transistor T2 to supply the driving current to the light-emitting element LE.

The gate electrode of the second transistor T2 is connected to the line of a first scan signal GW. The first electrode of the second transistor T2 is connected to the line of the data signal DATA. The second electrode of the second transistor T2 is connected to the first electrode of the first transistor T1. The second transistor T2 is turned on according to the first scan signal GW and performs a switching operation to transfer the data signal DATA to the first electrode of the first transistor T1.

The third transistor T3 may be implemented as a dual transistor including a first subsidiary transistor T3-1 and a second subsidiary transistor T3-2. The gate electrode of the first subsidiary transistor T3_1 is connected to the line of the first scan signal GW, the first electrode is connected to the second electrode of the second subsidiary transistor T3_2, and the second electrode is connected to the first electrode of the capacitor Cst, the first electrode of the third subsidiary transistor T4_1, and the gate electrode of the first transistor T1. The gate electrode of the second subsidiary transistor T3_2 may be connected to the line of the first scan signal GW, the first electrode may be connected to the second electrode of the first transistor T1, and the second electrode may be connected to the first electrode of the first subsidiary transistor T3_1.

The first subsidiary transistor T3_1 and the second subsidiary transistor T3_2 are turned on by the first scan signal GW to connect the gate electrode and the second electrode of the first transistor T1 so that the first transistor T1 is in diode connection. Accordingly, a voltage difference equal to the threshold voltage of the first transistor T1 is generated between the first electrode and the gate electrode of the first transistor T1. Deviations in the threshold voltage of the first transistor T1 can be compensated by supplying the data signal DATA that compensates for the threshold voltage to the gate electrode of the first transistor T1.

The fourth transistor T4 may be implemented as a dual transistor including a third subsidiary transistor T4_1 and a fourth subsidiary transistor T4_2. The gate electrode of the third subsidiary transistor T4_1 is connected to the line of the second scan signal GI, the first electrode is connected to the first electrode of the capacitor Cst, the second electrode of the first subsidiary transistor T3_1 and the gate electrode of the first transistor T1, and the second electrode is connected to the first electrode of the fourth subsidiary transistor T4_2. The gate electrode of the fourth subsidiary transistor T4_2 may be connected to the line of the second scan signal GI, the first electrode may be connected to the second electrode of the third subsidiary transistor T4_1, and the second electrode may be connected to the line of the initialization voltage VINT. The third subsidiary transistor T4_1 and the fourth subsidiary transistor T4_2 are turned on in response to the second scan signal GI to transfer the initialization voltage VINT to the gate electrode of the first transistor T1, to initialize the voltage at the gate electrode of the first transistor T1.

The gate electrode of the fifth transistor T5 is connected to the line of the emission control signal EM, the first electrode is connected to the first supply voltage line ELVDDL, and the second electrode is connected to the first electrode of the first transistor T1. The fifth transistor T5 is turned on by the emission control signal EM to connect the first electrode of the first transistor T1 with the first supply voltage line ELVDDL.

The sixth transistor T6 is connected between the second electrode of the first transistor T1 and the first electrode of the light-emitting element LE. The gate electrode of the sixth transistor T6 is connected to the line of the emission control signal EM, the first electrode is connected to the second electrode of the first transistor T1 and the first electrode of the second subsidiary transistor T3_2, and the second electrode is connected to the first electrode of the light-emitting element LE.

The fifth transistor T5 and the sixth transistor T6 are simultaneously turned on in response to the emission control signal EM so that the driving current flows through the light-emitting element LE.

The gate electrode of the seventh transistor T7 is connected to a line of the third scan signal GB. The first electrode of the seventh transistor T7 is connected to the anode electrode ANO of the light-emitting element LE. The second electrode of the seventh transistor T7 is connected to the line of the initialization voltage VINT. The seventh transistor T7 is turned on according to the third scan signal GB to initialize the anode electrode ANO of the organic light-emitting diode.

Although the third scan signal GB is applied to the gate electrode of the seventh transistor T7 in this embodiment of the present disclosure, the pixel circuit may be configured such that the emission control signal EM or the second scan signal GI is applied to the gate electrode of the seventh transistor T7 in other implementations.

The capacitor Cst is formed between the gate electrode of the first transistor T1 and the first supply voltage line ELVDDL, and includes a first electrode and a second electrode. The first electrode of the capacitor Cst may be connected to the gate electrode of the first transistor T1, the second electrode of the third transistor T3, and the first electrode of the fourth transistor T4, and the second electrode of the capacitor Cst may be connected to the first supply voltage line ELVDDL. The capacitor Cst may be used to regulate the data voltage applied to the gate electrode of the first transistor T1.

The cathode electrode CAT of the light-emitting element LE is connected to a second supply voltage line ELVSSL, and receives the second supply voltage ELVSS from the second supply voltage line ELVSSL. The light-emitting element LE displays an image by receiving a driving current (e.g., electrical current) from the first transistor T1 to emit light for displaying the image.

Hereinafter, the cross-sectional structure of the pixel PX which is described above will be described in detail.

FIG. 4 is a cross-sectional view of an embodiment of a pixel PX of a display panel 10.

Referring to FIG. 4, the display panel 10 may include a substrate SUB, a buffer layer BF, a semiconductor layer 110, a first insulating layer 121 (a first inorganic insulating layer), a first conductive layer 130, a second insulating layer 122 (a second inorganic insulating layer), a second conductive layer 140, a third insulating layer 123 (a third inorganic insulating layer), a third conductive layer 150, a fourth insulating layer 124 (first organic insulating layer), a fourth conductive layer 160, a fifth insulating layer 125 (a second organic insulating layer), a fifth conductive layer 170, a sixth insulating layer 126 (a third organic insulating layer), an anode electrode ANO, a pixel-defining layer PDL, an emission layer EML, a cathode electrode CAT, and an encapsulation layer 180. The layers may be stacked on one another in the above described order. Each of the layers may be made up of a single layer, or a stack of layers including a plurality of layers. Other layers may be further disposed between the layers.

The substrate SUB supports the layers disposed thereon. A transparent substrate may be used when the organic light-emitting display device is of a bottom-emission or both-sided emission type. When the organic light-emitting display device is of a top-emission type, a semitransparent or opaque substrate as well as a transparent substrate may be employed.

The substrate SUB may be a rigid substrate or a flexible substrate that can be bent, folded, rolled, and so on. An example of the material of the flexible substrate may be, but is not limited to, polyimide (PI).

The buffer layer BF may be disposed on the substrate SUB. The buffer layer BF may reduce or effectively prevent impurity ions from diffusing, may reduce or effectively prevent permeation of moisture or outside air, and may provide a flat surface. The buffer layer BF may include, but is not limited to, silicon nitride. It may include silicon oxide, silicon oxynitride, etc. The buffer layer BF may be eliminated depending on the type of the substrate SUB, process conditions, etc.

The semiconductor layer 110 is disposed on the buffer layer BF. The semiconductor layer 110 forms a channel of a thin-film transistor of the pixel PX. The semiconductor layer 110 may include polycrystalline silicon. It is, however, to be understood that the present disclosure is not limited thereto. The semiconductor layer 110 may include monocrystalline silicon, low-temperature polycrystalline silicon, amorphous silicon, or an oxide semiconductor. The oxide semiconductor may include, for example, a binary compound (ABx), a ternary compound (ABxCy) and a quaternary compound (ABxCyDz) containing indium, zinc, gallium, tin, titanium, aluminum, hafnium (Hf), zirconium (Zr), magnesium (Mg), etc.

The first insulating layer 121 is disposed on the semiconductor layer 110. The first insulating layer 121 may be a first gate insulating layer having a gate insulating features. The first insulating layer 121 may include an inorganic insulating material. The first insulating layer 121 may include a silicon compound, a metal oxide, etc. In an embodiment, for example, the first insulating layer 121 may include silicon oxide, silicon nitride, silicon oxynitride, aluminum oxide, tantalum oxide, hafnium oxide, zirconium oxide, titanium oxide, etc.

The first conductive layer 130 is disposed on the first insulating layer 121. The first conductive layer 130 may include a gate transistor electrode GAT (e.g., gate electrode) of a thin-film transistor of a pixel PX and a scan line connected thereto, a first capacitor electrode CE1 of a storage capacitor Cst. That is, the gate transistor electrode GAT, the scan line and the first capacitor electrode CE1 may be respective patterns of a same material layer (e.g., the first conductive layer 130). As being respective patterns of a same material layer, elements may be considered as in a same layer as each other.

The first conductive layer 130 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu).

The second insulating layer 122 may be disposed on the first conductive layer 130. The second insulating layer 122 may be an interlayer dielectric layer or a second gate insulating layer. The second insulating layer 122 may include an inorganic insulating material. The second insulating layer 122 may be made of, but is not limited to, the same material as the first insulating layer 121.

The second conductive layer 140 is disposed on the second insulating layer 122. The second conductive layer 140 may include a second capacitor electrode CE2 of the storage capacitor Cst. The second conductive layer 140 may be made of, but is not limited to, the same material as the first conductive layer 130.

The third insulating layer 123 is disposed on the second conductive layer 140. The third insulating layer 123 may be an interlayer dielectric layer. The third insulating layer 123 may include an inorganic insulating material. The third insulating layer 123 may be made of, but is not limited to, the same material as the first insulating layer 121.

The third conductive layer 150 is disposed on the third insulating layer 123. The third conductive layer 150 may include a first transistor electrode SD1 (e.g., first electrode) and a second transistor electrode SD2 (e.g., second electrode) of the thin-film transistor of the pixel PX. The first transistor electrode SD1 and the second transistor electrode SD2 of the thin film transistor may be electrically connected to the source region and the drain region of the semiconductor layer 110, respectively, through contact holes passing through the third insulating layer 123, the second insulating layer 122 and the first insulating layer 121. The first supply voltage line ELVDDL of the pixel PX may also be formed of the third conductive layer 150. The first supply voltage line ELVDDL may be electrically connected to the second capacitor electrode CE2 of the storage capacitor Cst through a contact hole penetrating through the third insulating layer 123. That is, the first transistor electrode SD1, the second transistor electrode SD2 and the first supply voltage line ELVDDL may be respective patterns of a same material layer (e.g., the third conductive layer 150).

The third conductive layer 150 may include at least one metal selected from aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The third conductive layer 150 may include a stack of multiple layers stacked on one another. In an embodiment, for example, the third conductive layer 150 may have a stack structure of Ti/Al/Ti, Mo/Al/Mo, Mo/AlGe/Mo, Ti/Cu, etc.

The fourth insulating layer 124 is disposed on the third conductive layer 150. The fourth insulating layer 124 covers the third conductive layer 150. The fourth insulating layer 124 may be a via layer. The fourth insulating layer 124 may include an organic insulating material. In an embodiment, for example, the fourth insulating layer 124 may include polyacrylate resin, epoxy resin, phenolic resin, polyamide resin, polyimide resin, unsaturated polyesters resin, poly phenylen ether resin, poly phenylene sulfide resin, benzocyclobutene (BCB), etc.

The fourth conductive layer 160 is disposed on the fourth insulating layer 124. The fourth conductive layer 160 may include a first anode connection electrode CNE1. The first anode connection electrode CNE1 may be electrically connected to the second transistor electrode SD2 of the thin-film transistor through a contact hole penetrating through the fourth insulating layer 124. The anode electrode ANO may be electrically connected to the second transistor electrode SD2 of the thin-film transistor through the first anode connection electrode CNE1 and a second anode connection electrode CNE2. The fourth conductive layer 160 may include the same material as the third conductive layer 150 or may include the same stack structure, but the present disclosure is not limited thereto.

The fifth insulating layer 125 is disposed on the fourth conductive layer 160. The fifth insulating layer 125 covers the fourth conductive layer 160. The fifth insulating layer 125 may be a via layer. The fifth insulating layer 125 may include an organic insulating material. The fifth insulating layer 125 may be made of, but is not limited to, the same material as the fourth insulating layer 124.

The fifth conductive layer 170 is disposed on the fifth insulating layer 125. The fifth conductive layer 170 may include the second anode connection electrode CNE2. The fifth conductive layer 170 may further include the second supply voltage line ELVSSL (see FIG. 3). That is, the second anode connection electrode CNE2 and the second supply voltage line ELVSSL may be respective patterns of a same material layer (e.g., the fifth conductive layer 170). The second anode connection electrode CNE2 may be electrically connected to the first anode connection electrode CNE1 through a contact hole penetrating the fifth insulating layer 125. The fifth conductive layer 170 may include the same material as the third conductive layer 150 or may include the same stack structure, but the present disclosure is not limited thereto.

The sixth insulating layer 126 is disposed on the fifth conductive layer 170. The sixth insulating layer 126 covers the fifth conductive layer 170. The sixth insulating layer 126 may be a via layer. The sixth insulating layer 126 may include an organic insulating material. The sixth insulating layer 126 may be made of, but is not limited to, the same material as the fourth insulating layer 124.

The anode electrode ANO is disposed on the sixth insulating layer 126. The anode electrode ANO may be a pixel electrode disposed in each of the pixels PX. The anode electrode ANO may be connected to the second anode connection electrode CNE2 through a contact hole penetrating the sixth insulating layer 126. The anode electrode ANO may at least partially overlap an emission area EMA (e.g., light emission area) of the pixel PX.

The anode electrode ANO may have, but is not limited to, a stack structure of a material layer having a high work function such as indium-tin-oxide (ITO), indium-zinc-oxide (IZO), zinc oxide (ZnO) and indium oxide ($In_2O_3$), and a reflective material layer such as silver (Ag), magnesium (Mg), aluminum (Al), platinum (Pt), lead (Pb), palladium (Pd), gold (Au), nickel (Ni), neodymium (Nd), iridium (Ir), chromium (Cr), lithium (Li), calcium (Ca) or a combination thereof. A layer having a higher work function may be disposed above a reflective material layer so that it is disposed closer to the emission layer EML than the reflective material layer. The anode electrode ANO may have, but is not limited to, a multilayer structure of ITO/Mg, ITO/MgF, ITO/Ag, and ITO/Ag/ITO.

A pixel-defining layer PDL may be disposed over the anode electrode ANO. The pixel-defining layer PDL may include or define an opening exposing the anode electrode ANO to outside the pixel-defining layer PDL. The emission area EMA and a non-emission area NEM may be distinguished by the pixel-defining layer PDL and the opening thereof. In an embodiment, the emission area EMA may correspond to the opening in the pixel-defining layer PDL while the non-emission area NEM corresponds to the solid portions of the pixel-defining layer PDL. The pixel-defining layer PDL may include an organic insulating material such as polyacrylate resin, epoxy resin, phenolic resin, polyamide resin, polyimide resin, unsaturated polyesters resin, poly phenylen ether resin, poly phenylene sulfide resin, and benzocyclobutene (BCB). The pixel-defining layer PDL may include an inorganic material.

The emission layer EML may be disposed on the anode electrode ANO exposed by the pixel-defining layer PDL to outside thereof. The emission layer EML may include an organic material layer. The organic material layer of the emission layer EML may include an organic emission layer and may further include a hole injecting/transporting layer and/or an electron injecting/transporting layer.

The cathode electrode CAT may be disposed on the emission material layer EML. The cathode electrode CAT may be a common electrode disposed across the pixels PX. The anode electrode ANO, the emission layer EML and the cathode electrode CAT may form an organic light-emitting element.

The cathode electrode CAT may be in contact with the emission material layer EML as well as the upper surface of the pixel-defining layer PDL. The cathode electrode CAT may be formed conformally to the underlying elements to reflect the step difference of the underlying elements. As being in contact, elements may form an interface or boundary therebetween.

The cathode electrode CAT may include a material layer having a small work function such as Li, Ca, LiF/Ca, LiF/Al, Al, Mg, Ag, Pt, Pd, Ni, Au, Nd, Ir, Cr, BaF and Ba, or a combination thereof (e.g., a combination of Ag and Mg). The cathode electrode CAT may further include a transparent metal oxide layer disposed on the material layer having a small work function.

The encapsulation layer 180 may be disposed on the cathode electrode CAT. The encapsulation layer 180 may include a first inorganic encapsulation layer 181, an organic encapsulation layer 182, and a second inorganic encapsulation layer 183 in order from the light-emitting element LE (e.g., in a direction away from the substrate SUB). The first inorganic encapsulation layer 181 and the second inorganic encapsulation layer 183 may be in contact with each other at the end of the encapsulation layer 180. The organic encapsulation layer 182 can be encapsulated by the first inorganic encapsulation layer 181 and the second inorganic encapsulation layer 183.

Each of the first inorganic encapsulation layer 181 and the second inorganic encapsulation layer 183 may include an inorganic insulating material such as silicon nitride, silicon oxide and silicon oxynitride. The organic encapsulation layer 182 may include an organic insulating material.

Figure 5:
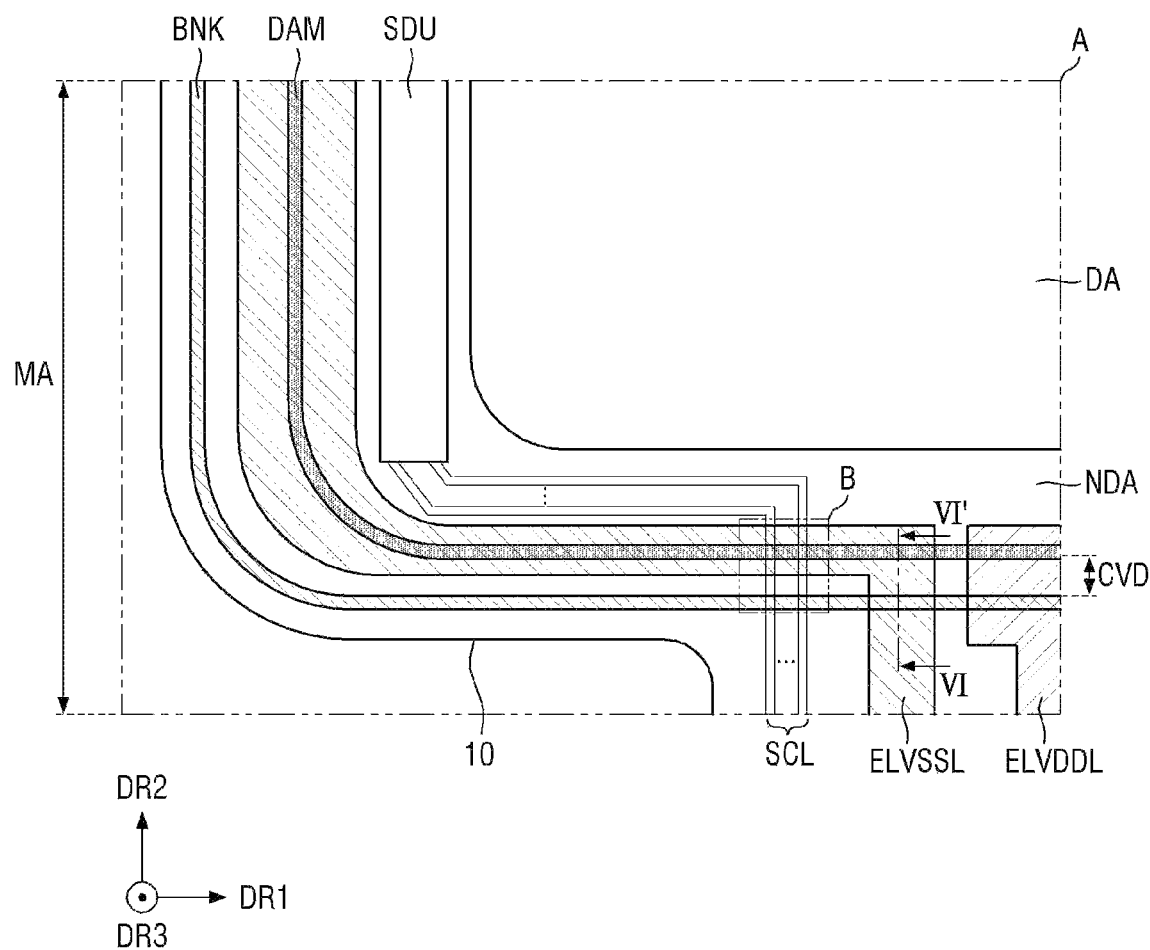
FIG. 5 is an enlarged plan view of area A of FIG. 1.

FIG. 5 is an enlarged plan view of area A of FIG. 1.

Referring to FIG. 5, the display panel 10 may further include a dam DAM, a bank BNK, a scan driver SDU, and a scan control line SCL.

The dam DAM may be disposed in the non-display area NDA and may be adjacent to the display area DA such as to surround the display area DA. The display area DA may be disposed in an area surrounded by the dam DAM. The dam DAM can suppress or effectively prevent an organic material inside the dam DAM from flowing out of the dam DAM and toward an outer edge of the display panel 10, such as in a process of fabricating (or providing) the display panel 10.

The bank BNK may be disposed in the non-display area NDA and may be adjacent to the dam DAM such as to surround the dam DAM. The dam DAM may be disposed in an area surrounded by the bank BNK. The bank BNK may support a mask (e.g., a fine metal mask (FMM)) used for fabricating the display panel 10.

The display panel 10 may further include an inorganic encapsulation area CVD. The inorganic encapsulation area CVD may be disposed between the dam DAM and the bank BNK in a direction along the substrate SUB. The organic encapsulation layer 182 (see FIG. 4) of the encapsulation layer 180 (see FIG. 4) may not be disposed in the inorganic encapsulation area CVD (e.g., may be excluded therefrom), and thus the first inorganic encapsulation layer 181 (see FIG. 4) and the second inorganic encapsulation layer 183 (see FIG. 4) of the encapsulation layer 180 (refer to FIG. 4) may be in direct contact with each other. In the inorganic encapsulation area CVD, only inorganic films (inorganic insulating layer and inorganic encapsulation layer) may be disposed, and the organic films (organic insulating layer and organic encapsulation layer 182) may be excluded. The inorganic encapsulation area CVD will be described in more detail later.

The scan driver SDU may be disposed in the non-display area NDA. The scan driver SDU may be disposed on at least one of opposing sides of the display area DA in the first direction DR1. The scan driver SDU may be electrically connected to the driver chip 20 (see FIG. 1) through the scan control line SCL. The scan driver SDU may receive a scan timing signal from the driver chip 20 (see FIG. FIG. 1). The scan driver SDU may generate scan signals according to the scan timing signal. The scan driver SDU may output the scan signal to the gate transistor electrode GAT of the thin-film transistor of the pixel PX through the scan line.

The scan control line SCL may be disposed in the non-display area NDA. The scan control line SCL may be disposed on the other side of the display area DA in the second direction DR2 (e.g., opposite to the display area DA). The scan control line SCL may be extended from the lower side of the scan driver SDU to the driver chip 20 (see FIG. 1). The scan control line SCL may overlap the dam DAM. In other words, the scan control line SCL extended from the scan driver SDU may be extended in the first direction DR1 on the inner side of the dam DAM and may be extended in the direction opposite to the second direction DR2 across the dam DAM, to be connected to the driver chip 20 (see FIG. 1). The scan control line SCL may overlap the dam DAM at a crossing area where the scan control line SCL crosses the dam DAM. In an embodiment, the signal line (e.g., scan control line SCL) may have a first end and a second end which is opposite to the first end, the scan driver SDU may be connected to the first end of the signal line, and the driver chip 20 may be connected to the second end of the signal line.

The first supply voltage line ELVDDL may be disposed to be separated from and spaced apart from the second supply voltage line ELVSSL in a direction along the substrate SUB. The first supply voltage line ELVDDL may be disposed on the other side of the display area DA in the second direction DR2.

The second supply voltage line ELVSSL may be disposed in the non-display area NDA. The second supply voltage line ELVSSL may be extended from the driver chip 20 (see FIG. 1), around the display area DA, and extend back to the driver chip 20 (see FIG. 1). In other words, a first end and a second end which is opposite to the first end (e.g., opposing ends) of the second supply voltage line ELVSSL may each be connected to the driver chip 20 (see FIG. 1), and the second supply voltage line ELVSSL may be extended around three sides of the display area DA (one side and the other side in the first direction DR1 and one side in the second direction DR2) which is furthest from the driver chip 20. The second supply voltage line ELVSSL may be disposed on the outer side of the scan driver SDU which is closest to the outer edge of the display panel 10. It should be understood, however, that the present disclosure is not limited thereto. The second supply voltage line ELVSSL may overlap the scan driver SDU.

The second supply voltage line ELVSSL may overlap or cross the dam DAM and the bank BNK. The second supply voltage line ELVSSL may be generally disposed on the inner side of the bank BNK which is furthest from the outer edge of the display panel 10. The second supply voltage line ELVSSL may overlap the dam DAM on the inner side of the bank BNK, is extended along the dam DAM, and then may be extended in the direction opposite to the second direction DR2, to be connected to the driver chip 20 (see FIG. 1). The second supply voltage line ELVSSL may be extended from the lower side of the display area DA to one side in the first direction DR1, then to the other side in the second direction DR2, and may cross the bank BNK. The second supply voltage line ELVSSL may overlap the bank BNK where the second supply voltage line ELVSSL crosses the bank BNK.

Cross-sectional structures of the second supply voltage line ELVSSL, the dam DAM and the bank BNK will be described with reference to FIG. 6.

Figure 6:
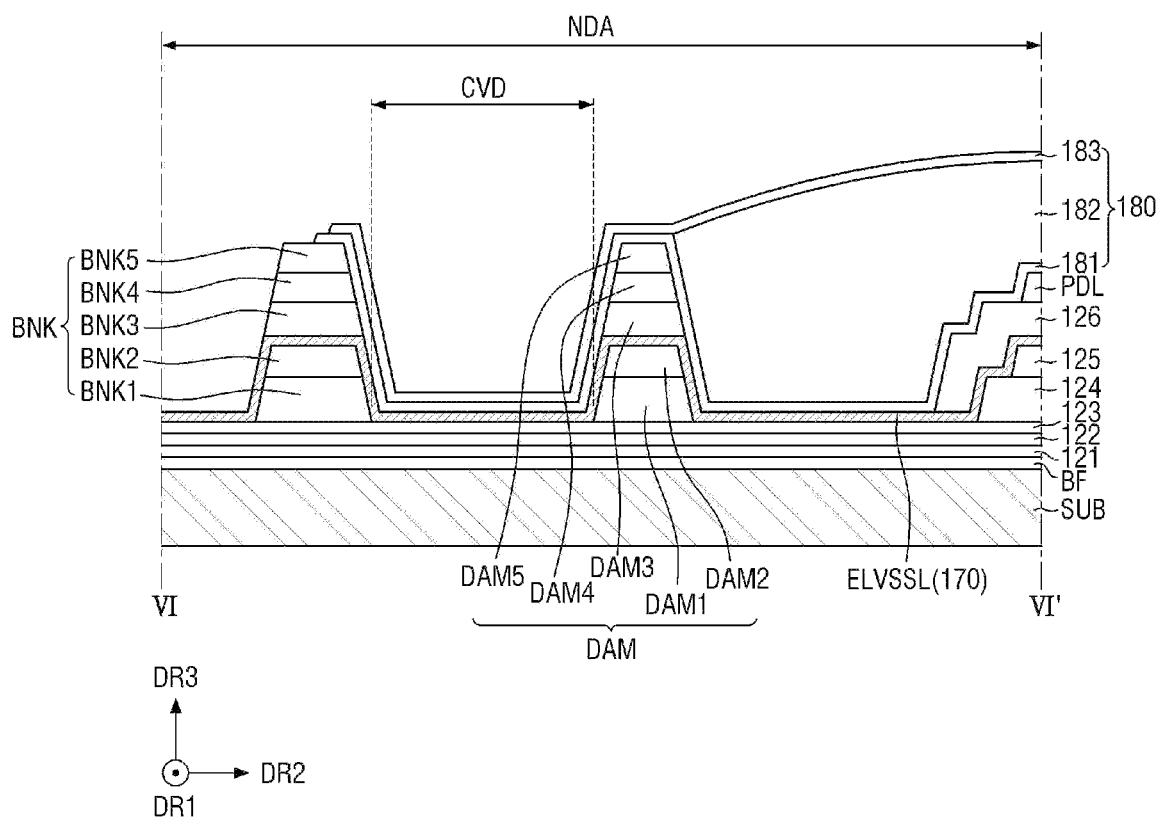
FIG. 6 is a cross-sectional view taken along line VI-VI' of FIG. 5.

FIG. 6 is a cross-sectional view taken along line VI-VI' of FIG. 5.

Referring to FIGS. 5 and 6, the dam DAM may include a first sub-dam DAM1, a second sub-dam DAM2, a third sub-dam DAM3, a fourth sub-dam DAM4 and a dam spacer DAM5 (e.g., fifth sub-dam) stacked on one another sequentially in a direction away from the substrate SUB. The bank BNK may include a first sub-bank BNK1, a second sub-bank BNK2, a third sub-bank BNK3, a fourth sub-bank BNK4, and a bank spacer BNK5 (e.g., fifth sub-bank) stacked on one another sequentially in a direction away from the substrate SUB.

The first sub-dam DAM1 and the first sub-bank BNK1 may be formed of the fourth insulating layer 124. In other words, since the first sub-dam DAM1 and the first sub-bank BNK1 are formed via the same process as the fourth insulating layer 124, the first sub-dam DAM1 and the first sub-bank BNK1 may include substantially the same material as the fourth insulating layer 124. In addition, the first sub-dam DAM1, the first SUB-bank BNK1 and the fourth insulating layer 124 may be substantially the same layer among layers on the substrate SUB (e.g., be respective patterns of a same material layer, that is, the fourth insulating layer 124). The first sub-dam DAM1 and the first sub-bank BNK1 may be disposed on the third insulating layer 123.

The second sub-dam DAM2 and the second sub-bank BNK2 may be formed of the fifth insulating layer 125. In other words, since the second sub-dam DAM2 and the second sub-bank BNK2 are formed via the same process as the fifth insulating layer 125, the second sub-dam DAM2 and the second sub-bank BNK2 may include substantially the same material as the fifth insulating layer 125. In addition, the second sub-dam DAM2 and the second sub-bank BNK2 may be disposed on the same layer as the fifth insulating layer 125. The second sub-dam DAM2 and the second sub-bank BNK2 may be disposed on the first sub-dam DAM1 and the first sub-bank BNK1, respectively. The second supply voltage line ELVSSL may be disposed on the second sub-dam DAM2 and the second sub-bank BNK2. The second supply voltage line ELVSSL may be formed of the fifth conductive layer 170.

The third sub-dam DAM3 and the third sub-bank BNK3 may be formed of the sixth insulating layer 126. In other words, since the third sub-dam DAM3 and the third sub-bank BNK3 are formed via the same process as the sixth insulating layer 126, the third sub-dam DAM3 and the third sub-bank BNK3 may include substantially the same material as the sixth insulating layer 126. The third sub-dams DAM3 and the third sub-banks BNK3 may be disposed on the second sub-dam DAM2 and the second sub-bank BNK2, respectively, with the second supply voltage line ELVSSL interposed therebetween. That is, the third sub-dams DAM3 and the third sub-banks BNK3 may respectively face the second sub-dam DAM2 and the second sub-bank BNK2, with the second supply voltage line ELVSSL interposed therebetween.

The fourth sub-dam DAM4 and the fourth sub-bank BNK4 may be formed of the pixel-defining layer PDL. In other words, since the fourth sub-dam DAM4 and the fourth sub-bank BNK4 are formed via the same process as the pixel-defining layer PDL, the fourth sub-dam DAM4 and the fourth sub-bank BNK4 may include substantially the same material as the pixel-defining layer PDL. In addition, the fourth sub-dam DAM4 and the fourth sub-bank BNK4 may be disposed on the same layer as the pixel-defining layer PDL. The fourth sub-dam DAM4 and the fourth sub-bank BNK4 may be disposed on the third sub-dam DAM3 and the third sub-bank BNK3, respectively.

The dam spacer DAM5 may protrude upward from the fourth sub-dam DAM4 in the thickness direction (the third direction DR3). The bank spacer BNK5 may protrude upward from the fourth sub-bank BNK4 in the thickness direction (the third direction DR3). The dam spacer DAM5 and the bank spacer BNK5 may support a mask, e.g., a fine metal mask (FMM) mask such as during a process in providing the dam DAM and the bank BNK.

In the inorganic encapsulation area CVD, the second supply voltage line ELVSSL may be exposed by the sixth insulating layer 126 and the pixel-defining layer PDL to outside the sixth insulating layer 126 and the pixel-defining layer PDL. In other words, the second supply voltage line ELVSSL may be exposed by the third sub-dam DAM3 and the third sub-bank BNK3 formed of the sixth insulating layer 126, and the fourth sub-dam DAM4 and the fourth sub-bank BNK4 formed of the pixel-defining layer PDL.

In the inorganic encapsulation area CVD, the second supply voltage line ELVSSL may be in direct contact with the first inorganic encapsulation layer 181. In the inorganic encapsulation area CVD, the first inorganic encapsulation layer 181 may be in direct contact with the second inorganic encapsulation layer 183. In the inorganic encapsulation area CVD, organic films, for example, the fourth insulating layer 124, the fifth insulating layer 125, the sixth insulating layer 126, the pixel-defining layer PDL and the organic encapsulation layer 182 may not be disposed. That is to say, the encapsulation layer 180 may encapsulate the organic encapsulation layer 182 in the inorganic encapsulation area CVD. By virtue of the inorganic encapsulation area CVD, it is possible to block outside air and moisture that may permeate into the display panel 10 through the organic films.

The second supply voltage line ELVSSL may overlap a signal line in the inorganic encapsulation area CVD. In an embodiment, for example, the second supply voltage line ELVSSL may overlap the scan control line SCL as the signal line which transmits an electrical signal. At least a part of the planar area where the second supply voltage line ELVSSL and the scan control line SCL overlap each other may be disposed in the inorganic encapsulation area CVD. In other words, the second supply voltage line ELVSSL may overlap the scan control line SCL in the inorganic encapsulation area CVD. In this instance, along the thickness direction of the display panel 10, an etch stop pattern EST (see FIG. 7) may be further disposed between the second supply voltage line ELVSSL and the scan control line SCL in the inorganic encapsulation area CVD, to suppress or effectively prevent defects such as an electrical current leakage between the second supply voltage line ELVSSL and the scan control line SCL.

It should be noted that the signal line is not limited to the scan control line SCL. The second supply voltage line ELVSSL may overlap a data signal line that transmits a data signal as a signal line.

Figure 7:
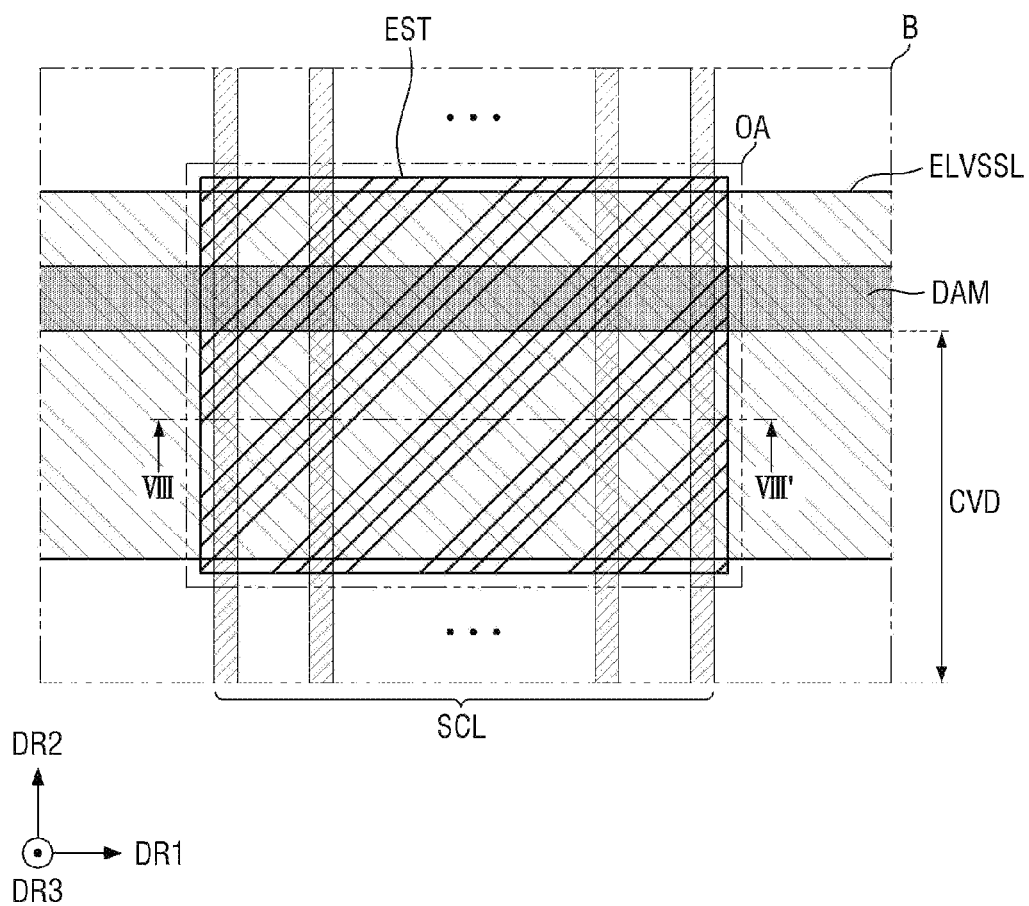
FIG. 7 is an enlarged view of area B of FIG. 5.
Figure 8:
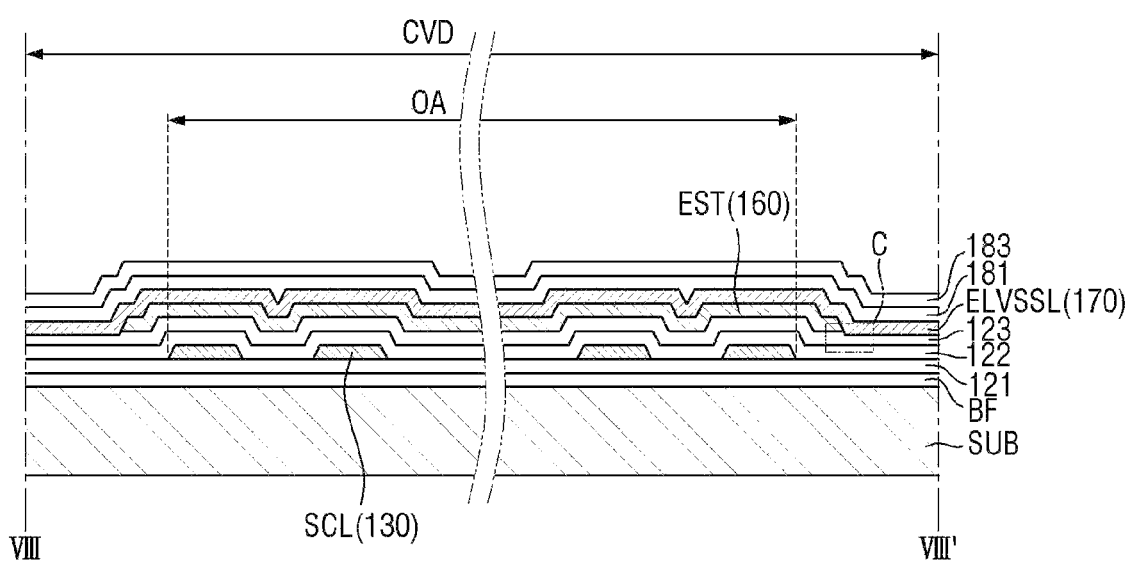
FIG. 8 is a cross-sectional view taken along line VIII-VIII' of FIG. 7.
Figure 8:
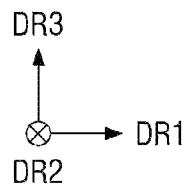
Figure 9:
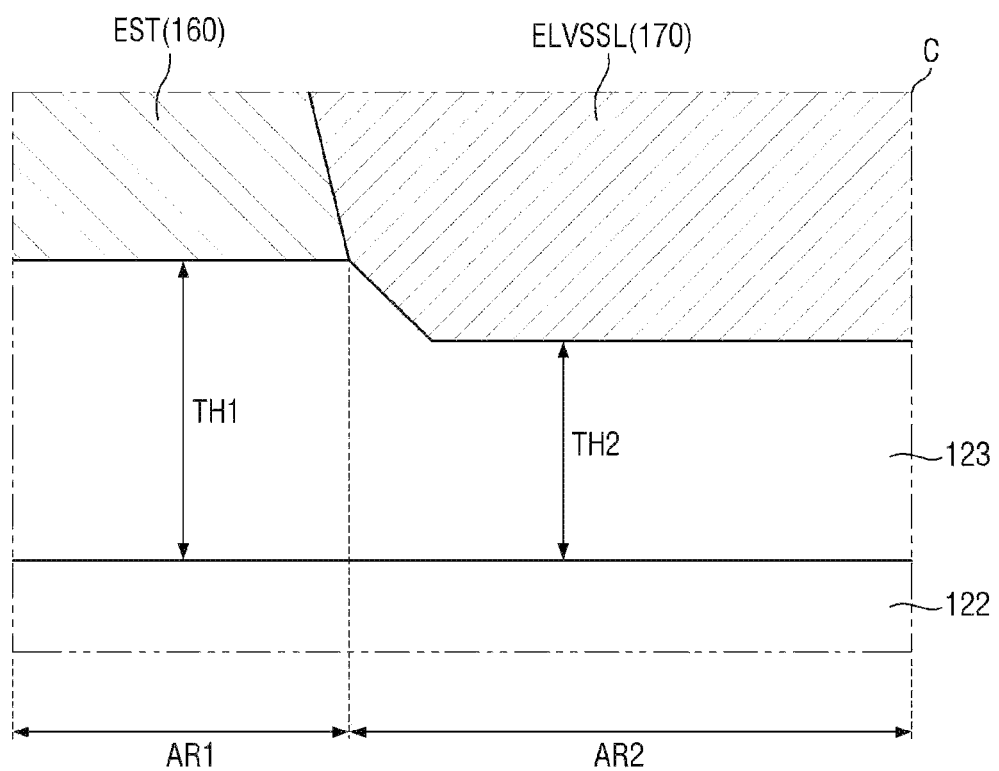
FIG. 9 is an enlarged view of portion C of FIG. 8.

FIG. 7 is an enlarged view of area B of FIG. 5. FIG. 8 is a cross-sectional view taken along line VIII-VIII' of FIG. 7. FIG. 9 is an enlarged view of portion C of FIG. 8.

Referring to FIGS. 7 to 9, the display panel 10 may further include an etch stop pattern EST. The etch stop pattern EST may overlap or correspond to at least a part of the second supply voltage line ELVSSL. At least a part of the etch stop pattern EST may be disposed between the second supply voltage line ELVSSL and the scan control line SCL with respect to the thickness direction (the third direction DR3) in the inorganic encapsulation area CVD.

In other words, within the inorganic encapsulation area CVD, the display panel 10 may further include an overlapping area OA at which the second supply voltage line ELVSSL and the scan control line SCL overlap each other in the thickness direction (the third direction DR3). At least a part of the overlapping area OA may be located in the inorganic encapsulation area CVD. A portion of the etch stop pattern EST may be disposed in the overlapping area OA. A portion of the etch stop pattern EST may be disposed in the inorganic encapsulation area CVD.

In the inorganic encapsulation area CVD, the etch stop pattern EST may be in direct contact with the second supply voltage line ELVSSL. The etch stop pattern EST may be formed of the fourth conductive layer 160. It should be understood, however, that the present disclosure is not limited thereto. The etch stop pattern EST may be formed of the third conductive layer 150 (see FIG. 4).

The etch stop pattern EST can suppress or effectively prevent that the thickness of a respective inorganic film under the second supply voltage line ELVSSL is reduced by etching. In an embodiment, for example, when the etch stop pattern EST is formed of the fourth conductive layer 160, an upper part (e.g., upper thickness portion) of the third insulating layer 123 that does not overlap the fourth conductive layer 160 may be etched together with the fourth conductive layer 160 during the process of patterning the fourth conductive layer 160, and thus the thickness of the third insulating layer 123 may be reduced. If the thickness of the third insulating layer 123 is reduced, the distance between the second supply voltage line ELVSSL and the scan control line SCL (or the thickness of the inorganic film between the second supply voltage line ELVSSL and the scan control line SCL) may be reduced.

In particular, if the thickness of the third insulating layer 123 is reduced in the inorganic encapsulation area CVD where only the inorganic films are disposed between the second supply voltage line ELVSSL and the scan control line SCL, defects may occur between the second supply voltage line ELVSSL and the scan control line SCL. A defect may include a short-circuit between the second supply voltage line ELVSSL and the scan control line SCL due to a gap that may occur on the side surface of the scan control line SCL, electrical current leakage due to such short circuit, and coupling due to a parasitic capacitance formed between the second supply voltage line ELVSSL and the scan control line SCL.

In contrast, in one or more embodiment, by disposing the etch stop pattern EST between the second supply voltage line ELVSSL and the scan control line SCL in the overlapping area OA where the second supply voltage line ELVSSL and the scan control line SCL overlap each other, reduction of the thickness of the third insulating layer 123 overlapping the etch stop pattern EST is suppressed or effectively prevented even though the fourth conductive layer 160 is patterned.

In other words, within the inorganic encapsulation area CVD, the third insulating layer 123 may include a first area AR1 that overlaps or corresponds to the etch stop pattern EST in the thickness direction (the third direction DR3) and a second area AR2 that does not overlap the etch stop pattern EST. The third insulating layer 123 may extend further than the etch stop pattern EST to define the second area AR2. The third insulating layer 123 may have a first thickness TH1 in the first area AR1 and may have a second thickness TH2 in the second area AR2. The first thickness TH1 may be greater than the second thickness TH2. Herein, the second area AR2 may refer to a planar area that does not overlap an entirety of the fourth conductive layer 160 as well as the etch stop pattern EST. That is the second area AR2 may refer to a planar area that is adjacent to an entirety of the fourth conductive layer 160 as well as the etch stop pattern EST in a direction along the substrate SUB.

Accordingly, by virtue of the etch stop pattern EST, reduction of the thickness of the inorganic film disposed between the second supply voltage line ELVSSL and the scan control line SCL in the inorganic encapsulation area CVD is suppressed or effectively prevented, such that defects such as electrical current leakage and coupling between the second supply voltage line ELVSSL and the scan control line SCL are suppressed or effectively prevented.

In the foregoing description, the second supply voltage line ELVSSL and the signal line overlap each other, but the present disclosure is not limited thereto. The description on the second supply voltage line ELVSSL can be equally applied to the first supply voltage line ELVDDL.

Hereinafter, embodiments of the present disclosure will be described. In the following description, the same or similar elements will be denoted by the same or similar reference numerals, and redundant descriptions will be omitted or briefly described. Descriptions will be made focusing on differences from the above embodiment.

Figure 10:
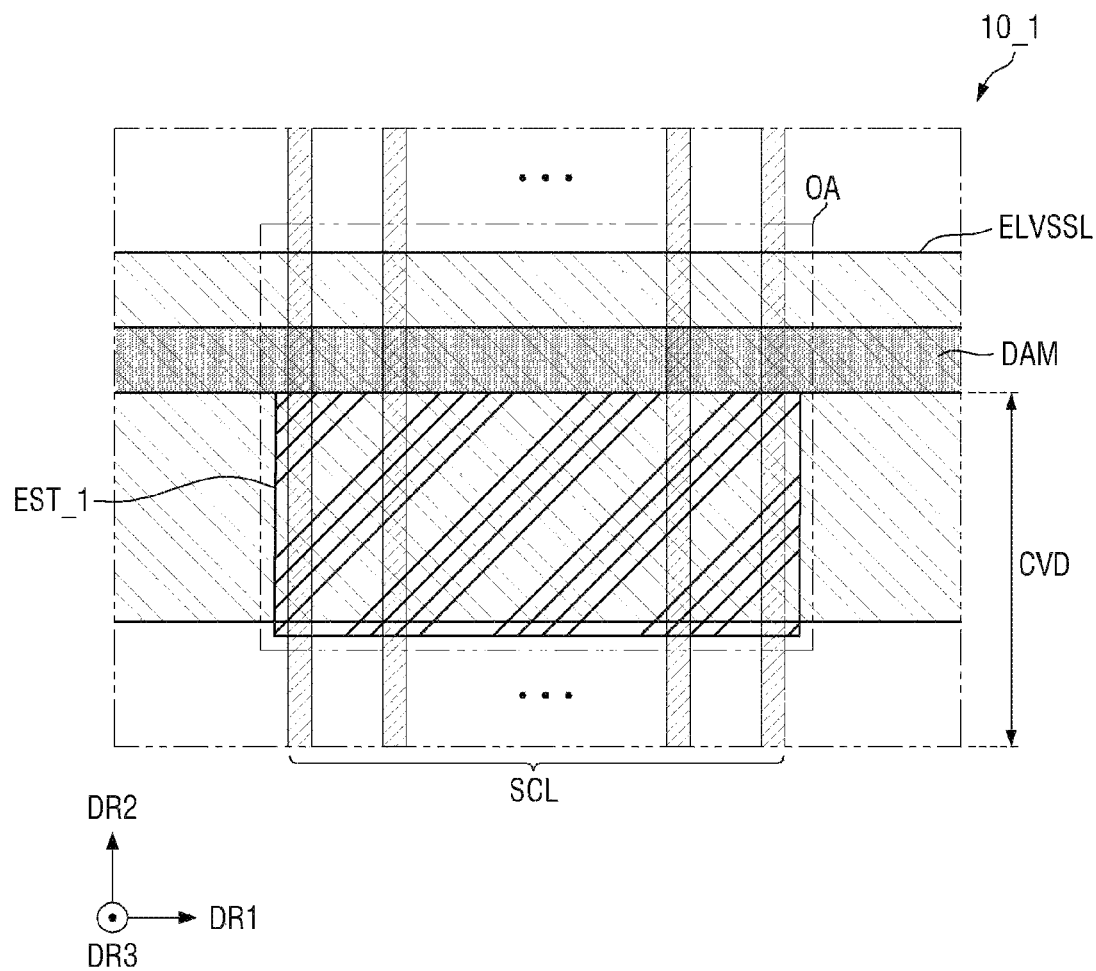
FIG. 10 is a plan view of an embodiment of a display panel.

FIG. 10 is a plan view of a portion of a display panel 10_1.

The embodiment of FIG. 10 includes an etch stop pattern EST_1 of a display panel 10_1 disposed only in the inorganic encapsulation area CVD. The etch stop pattern EST_1 may be disposed only in the inorganic encapsulation area CVD, and may be disposed in the overlapping area OA where the scan control line SCL and the second power voltage line ELVSSL overlap each other.

Even in this case, defects such as electrical current leakage between the second supply voltage line ELVSSL and the scan control line SCL can be suppressed or effectively prevented by the etch stop pattern EST_1. In addition, a variety of designs of the etch stop pattern EST_1 are possible.

Figure 11:
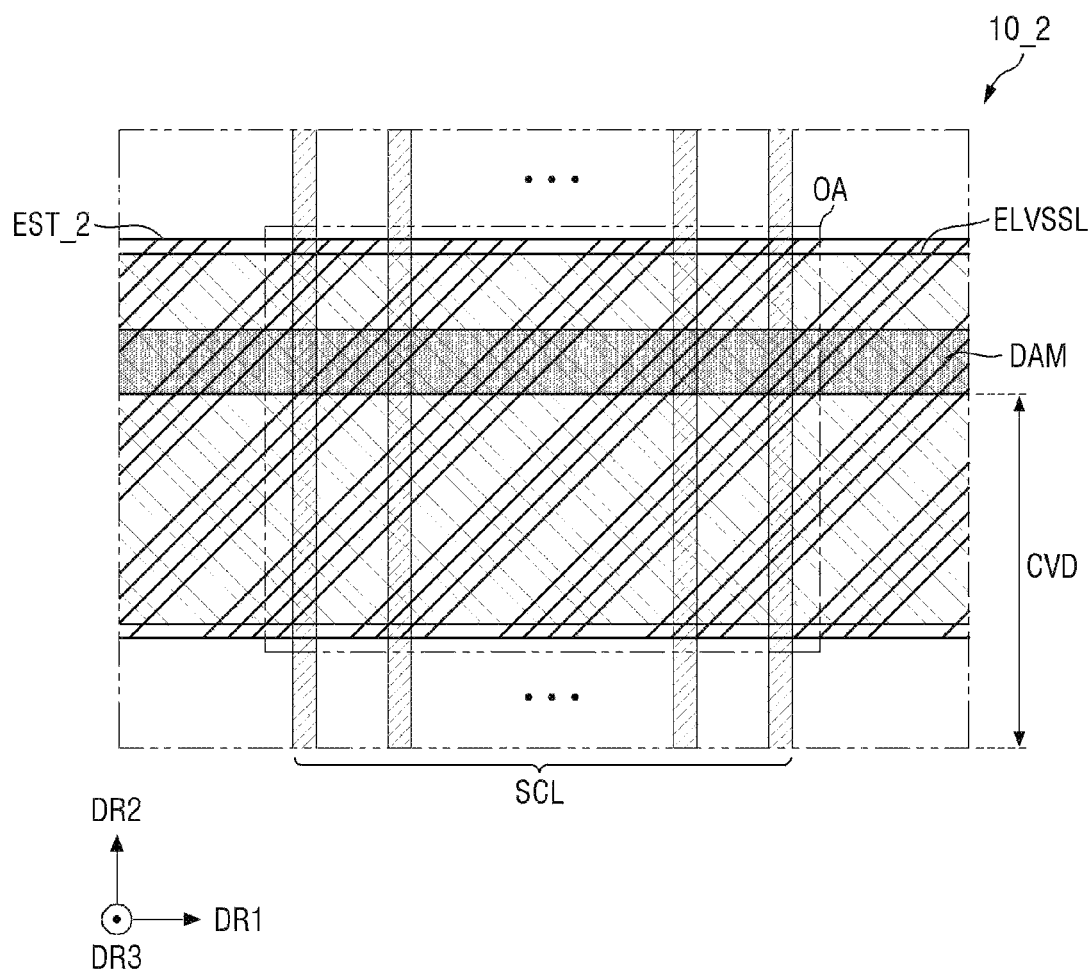
FIG. 11 is a plan view of an embodiment of a display panel.

FIG. 11 is a plan view of a portion of a display panel 10_2.

The embodiment of FIG. 11 includes an etch stop pattern EST_2 of a display panel 10_2 which overlaps an entirety of the second supply voltage line ELVSSL. The etch stop pattern EST_2 may have the same pattern shape as that of the second supply voltage line ELVSSL when viewed from the top (e.g., plan view) and may overlap an entirety of the second supply voltage line ELVSSL. Alternatively, the etch stop pattern EST_2 may have a larger planar area than the second supply voltage line ELVSSL when viewed from the top. In other words, the etch stop pattern EST_2 may overlap an entirety of the second supply voltage line ELVSSL, and the second supply voltage line ELVSSL may overlap a part of the etch stop pattern EST_2. As having a larger planar area, the etch stop pattern EST_2 may extend further than outer edges of the second supply voltage line ELVSSL in a direction along the substrate SUB.

Even in this case, defects such as electrical current leakage between the second supply voltage line ELVSSL and the scan control line SCL can be suppressed or effectively prevented by the etch stop pattern EST_2. In addition, the second supply voltage line ELVSSL is in direct contact with the etch stop pattern EST_2 in the inorganic encapsulation area CVD (for example, FIG. 8), so that the same effect can be obtained as if the thickness of the second supply voltage line ELVSSL was increased. As a result, the same effect can be obtained as if the resistance of the line through which the current flows by the second supply voltage ELVSS was reduced.

A width of a signal line may be taken perpendicular to a length direction thereof. Referring further to FIG. 5, the width of the second supply voltage line ELVSSL on the other side of the display area DA (e.g., in area B) may be taken along the second direction DR2, and may have a width on one side and the other side of the display area DA in the first direction DR1 which is taken along the first direction DR1. The width of the second supply voltage line ELVSSL on the other side of the display area DA in the second direction DR2 (e.g., in area B) may than smaller than the width on one side and the other side of the display area DA in the first direction DR1. In this regard, by disposing the etch stop pattern EST_2 extending further than an outer edge of the second supply voltage line ELVSSL and in direct contact with the second supply voltage line ELVSSL, it is possible to suppress or effectively prevent defects such as heat generation even though the thickness of the part of the second supply voltage line ELVSSL disposed on the other side in the second direction DR2 is reduced.

Figure 12:
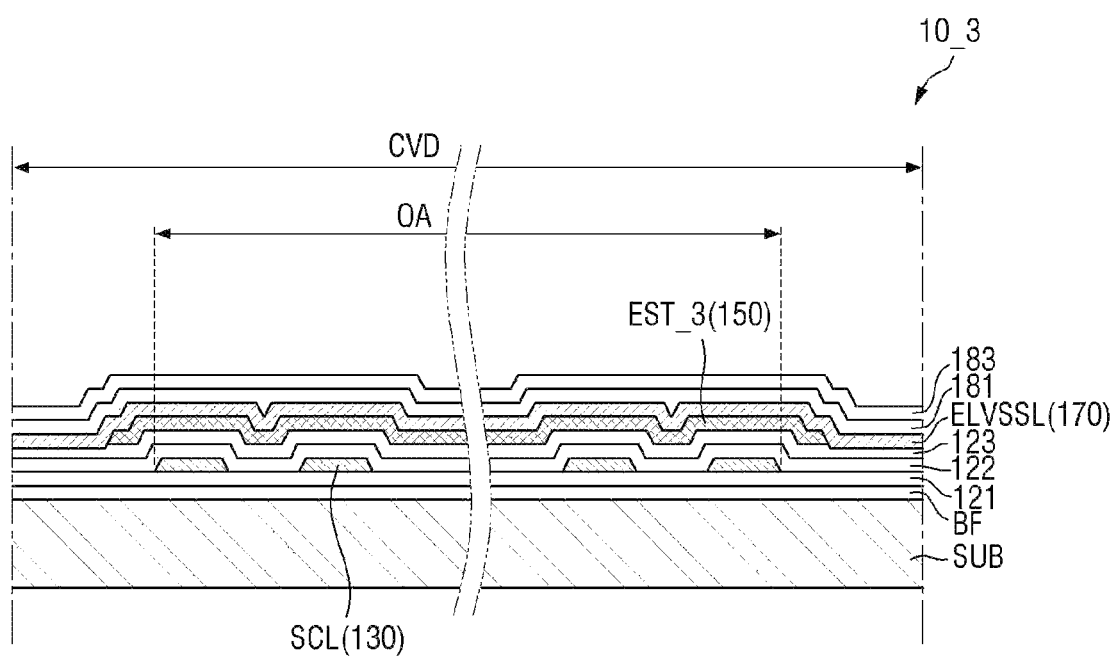
FIG. 12 is a cross-sectional view of an embodiment of a display panel.
Figure 12:
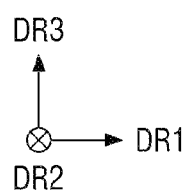

FIG. 12 is a cross-sectional view of an embodiment of a display panel 10_3.

The embodiment of FIG. 12 includes an etch stop pattern EST_3 of a display panel 10_3 formed of the third conductive layer 150. Even in this case, defects such as electrical current leakage between the second supply voltage line ELVSSL and the scan control line SCL can be suppressed or effectively prevented by the etch stop pattern EST_3. In addition, as the etch stop pattern EST_3 is formed of the third conductive layer 150, the third insulating layer 123 is etched neither by the patterning of the fourth conductive layer 160 nor by the patterning of the third conductive layer 150. Accordingly, the thickness of the third insulating layer 123 between the etch stop pattern EST_3 and the second supply voltage line ELVSSL can be maintained more reliably.

Figure 13:
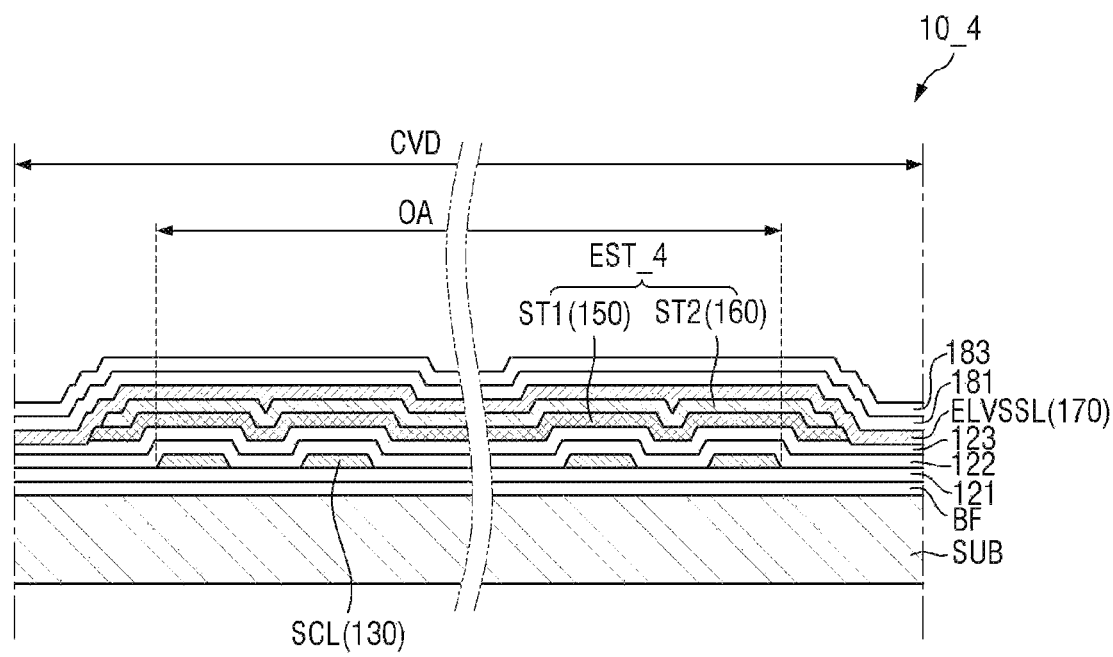
FIG. 13 is a cross-sectional view of an embodiment of a display panel.

FIG. 13 is a cross-sectional view of an embodiment of a display panel 10_4.

The embodiment of FIG. 13 includes an etch stop pattern EST_4 of a display panel 10_4 provided by a stack of multiple layers. The etch stop pattern EST_4 may include a first stack pattern ST1 together with a second stack pattern ST2, in order from the substrate SUB. The first stack pattern ST1 may be formed as a pattern of the third conductive layer 150, and the second stack pattern ST2 may be formed as a pattern of the fourth conductive layer 160.

Even in this case, defects such as electrical current leakage between the second supply voltage line ELVSSL and the scan control line SCL can be suppressed or effectively prevented by the etch stop pattern EST_4. In addition, as the etch stop pattern EST_4 is formed of the third conductive layer 150, the third insulating layer 123 is etched neither by the patterning of the fourth conductive layer 160 nor by the patterning of the third conductive layer 150. Accordingly, the thickness of the third insulating layer 123 between the etch stop pattern EST_4 and the second supply voltage line ELVSSL can be maintained more reliably.

What is claimed is:

1. A display device comprising:
    a display area comprising a light-emitting element, the light-emitting element comprising a first electrode, an emission layer and a second electrode;
    an encapsulation layer over the light-emitting element, the encapsulation layer comprising:
        a first inorganic encapsulation layer, an organic encapsulation layer and a second inorganic encapsulation layer in order, and
        an overlapping area of the first inorganic encapsulation layer and the second inorganic encapsulation layer in direct contact with each other to define an inorganic encapsulation area of the display device;
    a supply voltage line electrically connected to the second electrode of the light-emitting element;
    a signal line which provides an electrical signal to the display area; and
    within the inorganic encapsulation area of the display device:
        the signal line overlapping the supply voltage line; and
        an etch stop pattern between the supply voltage line and the signal line which overlap each other.

2. The display device of claim 1, wherein the inorganic encapsulation area comprises an overlapping area where the supply voltage line and the signal line overlap each other.

3. The display device of claim 2, wherein the etch stop pattern corresponds to the overlapping area.

4. The display device of claim 1, further comprising in order:
    a substrate;
    a first conductive layer;
    a first organic insulating layer;
    a second conductive layer;
    a second organic insulating layer; and
    a third conductive layer comprising the supply voltage line.

5. The display device of claim 4, wherein the etch stop pattern is a pattern of the first conductive layer or the second conductive layer.

6. The display device of claim 5, wherein within the inorganic encapsulation area of the display device, the supply voltage line and the etch stop pattern are in direct contact with each other.

7. The display device of claim 4, wherein within the inorganic encapsulation area of the display device, the etch stop pattern comprises:
    a first stack pattern as a pattern of the first conductive layer, and
    a second stack pattern as a pattern of the second conductive layer.

8. The display device of claim 4, further comprising in order:
    the third conductive layer,
    a third organic insulating layer, and
    the first electrode, the emission layer and the second electrode of the light-emitting element.

9. The display device of claim 1, further comprising within the inorganic encapsulation area of the display device:
    an inorganic insulating layer between the etch stop pattern and the signal line, and
    the inorganic insulating layer comprising:
        a first thickness corresponding to the etch stop pattern, and
        a second thickness outside of the etch stop pattern, the second thickness smaller than the first thickness.

10. The display device of claim 1, wherein the first inorganic encapsulation layer is in direct contact with the supply voltage line within the inorganic encapsulation area.

11. The display device of claim 1, further comprising:
    the signal line comprising a first end and a second end which is opposite to the first end;
    a scan driver connected to the first end of the signal line; and
    a driver chip connected to the second end of the signal line.

12. The display device of claim 1, further comprising a non-display area adjacent to the display area, the non-display area comprising:
    a dam,
    a bank spaced apart from the dam and further from the display area than the dam, and
    the inorganic encapsulation area between the dam and the bank,
    wherein the supply voltage line and the signal line overlap each other in the non-display area.

13. A display device comprising:
    a substrate;
    an encapsulation layer on the substrate;
    in order in a thickness direction from the substrate to the encapsulation layer:
        a signal line;
        a first inorganic insulating layer;
        a first conductive layer;
        a first organic insulating layer;
        a second conductive layer;
        a second organic insulating layer;
        a third conductive layer comprising a supply voltage line which overlaps the signal line to define an overlapping area where the supply voltage line and the signal line overlap each other;
        a third organic insulating layer;
        a light-emitting element comprising a first electrode, an emission layer and a second electrode in order from the substrate, the light-emitting element electrically connected to the supply voltage line; and
        the encapsulation layer comprising a first inorganic encapsulation layer, an organic encapsulation layer and a second inorganic encapsulation layer in order in the thickness direction; and
    an etch stop pattern corresponding to the overlapping area.

14. The display device of claim 13, further comprising:
    an inorganic encapsulation area in which the first inorganic encapsulation layer and the second inorganic encapsulation layer are in direct contact with each other,
    a portion of the inorganic encapsulation area corresponding to the overlapping area where the supply voltage line and the signal line overlap each other, and
    within the portion of the inorganic encapsulation area, the etch stop pattern as a pattern of the first conductive layer or the second conductive layer.

15. The display device of claim 14, further comprising:
    a dam spaced apart from the light-emitting element;
    a bank spaced apart from the dam and further from the light-emitting element than the dam, and the inorganic encapsulation area between the dam and the bank.

16. The display device of claim 15, wherein the first inorganic encapsulation layer is in direct contact with the supply voltage line within the inorganic encapsulation area.

17. The display device of claim 13, further comprising:
a display area comprising the light-emitting element;
a non-display area adjacent to the display area, and
the non-display area including an inorganic encapsulation area in which the first inorganic encapsulation layer and the second inorganic encapsulation layer are in direct contact with each other.

18. The display device of claim 13, wherein the supply voltage line and the etch stop pattern are in direct contact with each other.

19. A display device comprising:
a display area comprising a light-emitting element comprising a first electrode, an emission layer and a second electrode;
an encapsulation layer over the light-emitting element and comprising a first inorganic encapsulation layer, an organic encapsulation layer, and a second inorganic encapsulation layer;
a supply voltage line electrically connected to the second electrode of the light-emitting element;
a signal line which provides an electrical signal to the display area and overlaps the supply voltage line;
an etch stop pattern between the supply voltage line and the signal line; and
an inorganic insulating layer between the etch stop pattern and the signal line,
wherein the inorganic insulating layer comprises:
a first thickness corresponding to the etch stop pattern, and
a second thickness outside of the etch stop pattern, the second thickness smaller than the first thickness.

20. The display device of claim 19, further comprising:
an overlapping area where the supply voltage line and the signal line overlap each other,
an inorganic encapsulation area where the first inorganic encapsulation layer and the second inorganic encapsulation layer are in direct contact with each other, a portion of the inorganic encapsulation area corresponding to the overlapping area,
a dam,
a bank spaced apart from the dam and further from the display area than the dam, and
the inorganic encapsulation area between the dam and the bank, and
the etch stop pattern corresponding to the portion of the inorganic encapsulation area which corresponds to the overlapping area.

* * * * *